(12) United States Patent
Miyatake et al.

(10) Patent No.: US 8,773,195 B2
(45) Date of Patent: *Jul. 8, 2014

(54) SEMICONDUCTOR DEVICE HAVING A COMPLEMENTARY FIELD EFFECT TRANSISTOR

(76) Inventors: Shinichi Miyatake, Tokyo (JP); Seiji Narui, Tokyo (JP); Hitoshi Tanaka, Tokyo (JP)

(*) Notice: Subject to any disclaimer, the term of this patent is extended or adjusted under 35 U.S.C. 154(b) by 578 days.

This patent is subject to a terminal disclaimer.

(21) Appl. No.: 12/662,044

(22) Filed: Mar. 29, 2010

(65) Prior Publication Data

US 2010/0244908 A1  Sep. 30, 2010

(30) Foreign Application Priority Data

Mar. 30, 2009  (JP) .................................. 2009-080985

(51) Int. Cl.
*H03K 3/01* (2006.01)
*G05F 3/02* (2006.01)

(52) U.S. Cl.
USPC ......................................... 327/534; 327/535

(58) Field of Classification Search
USPC ......... 327/530, 534, 537, 538, 541, 543, 546; 330/267
See application file for complete search history.

(56) References Cited

U.S. PATENT DOCUMENTS

| | | | |
|---|---|---|---|
| 5,552,979 A * | 9/1996 | Gu et al. ........................ | 363/98 |
| 7,498,865 B2 * | 3/2009 | Sakiyama et al. ............ | 327/534 |
| 7,659,769 B2 | 2/2010 | Nakaya et al. | |
| 8,008,659 B2 | 8/2011 | Ikenaga et al. | |
| 2003/0102904 A1 | 6/2003 | Mizuno et al. | |
| 2004/0135621 A1 | 7/2004 | Sumita et al. | |
| 2005/0116765 A1 * | 6/2005 | Sakiyama et al. ............ | 327/534 |
| 2010/0244936 A1 * | 9/2010 | Miyatake et al. ............. | 327/537 |

FOREIGN PATENT DOCUMENTS

| | | |
|---|---|---|
| JP | 08-083487 | 3/1996 |
| JP | 2002-232243 A | 8/2002 |
| JP | 2003-168735 A | 6/2003 |
| JP | 2004-165649 A | 6/2004 |
| JP | 2005-166698 A | 6/2005 |
| JP | 2006-129392 A | 5/2006 |
| JP | 2008-59680 | 3/2008 |
| WO | WO 2004/077673 | 9/2004 |

* cited by examiner

*Primary Examiner* — Tuan T Lam
(74) *Attorney, Agent, or Firm* — McGinn IP Law Group, PLLC

(57) ABSTRACT

A semiconductor device prevents the ON current of a complementary field effect transistor from varying with changes in ambient temperature. The semiconductor device includes: a buffer circuit that generates a power-supply voltage of a CMOS; a first replica transistor that is a replica of a p-channel MOS transistor forming the CMOS, and is diode-connected; a second replica transistor that is a replica of an n-channel MOS transistor forming the CMOS, and is diode-connected; and a voltage controller that controls the voltage between the anode and cathode of the replica transistors so that the current value of the current flowing into the replica transistor becomes equal to a given target value. In this semiconductor device, the buffer circuit generates the power-supply voltage, with the target voltage being a voltage that is controlled by the voltage controller.

39 Claims, 14 Drawing Sheets

US 8,773,195 B2

SEMICONDUCTOR DEVICE HAVING A COMPLEMENTARY FIELD EFFECT TRANSISTOR

BACKGROUND OF THE INVENTION

1. Field of the Invention

The present invention relates to a semiconductor device, and more particularly, to a semiconductor device that can restrict fluctuations of the ON current of a complementary field effect transistor.

2. Description of Related Art

In semiconductor devices such as a DRAM (Dynamic Random Access Memory), complementary field effect transistors such as a CMOS (Complementary Metal Oxide Semiconductor) are often used for peripheral circuits (see Japanese Patent Application Laid-Open No. 2008-059680, for example).

In recent years, miniaturization and lowering of voltage are being rapidly achieved in the development of semiconductor devices. As the miniaturization and the lowering of voltage progress, the variations among the threshold voltages of the transistors forming complementary field effect transistors become larger, and the fluctuation of the ON current becomes larger accordingly. Also, due to the lowering of the threshold voltage, the OFF current of the entire chip cannot be ignored, and the fluctuations of the OFF current adversely affect the standby current.

SUMMARY

In one embodiment, there is provided a semiconductor device comprising: a buffer circuit that generates a power-supply voltage of a complementary field effect transistor circuit including a first field effect transistor of a first conductivity type and a second field effect transistor of a second conductivity type; a first replica transistor that is a replica of the first field effect transistor, the first replica transistor being diode-connected; a second replica transistor that is a replica of the second field effect transistor, the second replica transistor being diode-connected; and a voltage control circuit that controls a voltage between an anode and a cathode shared by the first and second replica transistors in such a manner that a total current value of currents flowing in the first and second replica transistors becomes equal to a predetermined first target value, wherein the buffer circuit generates the power-supply voltage, with a target voltage being the voltage between the anode and cathode controlled by the voltage control circuit.

In another embodiment, there is provided a semiconductor device comprising: a buffer circuit that generates a power-supply voltage of a complementary field effect transistor circuit including a first field effect transistor of a first conductivity type and a second field effect transistor of a second conductivity type; a first replica transistor that is a replica of the first field effect transistor, the first replica transistor being diode-connected; a second replica transistor that is a replica of the second field effect transistor, the second replica transistor being diode-connected; a noninverting amplifier that includes first and second input terminals, a first output terminal, and a feedback resistor inserted between the first output terminal and the second input terminal; a comparator that includes third and fourth input terminals and a second output terminal; and a first input voltage generating circuit that generates a voltage that appears in the first output terminal when a total current value of currents flowing in the first and second replica transistors is equal to a predetermined first target value, the first input voltage generating circuit outputting the voltage to the third input terminal, wherein the first input terminal and the second output terminal are connected to each other, and the first output terminal and the fourth input terminal are connected to each other, the first and second replica transistors are inserted in a forward direction and in parallel between the second input terminal and a ground, and the buffer circuit generates the power-supply voltage, with a target voltage being a voltage that is output from the second output terminal.

According to the present invention, variations of the ON current of complementary field effect transistors among products can be reduced, and fluctuations of the ON current of the complementary field effect transistors due to changes in ambient temperature can be restricted.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will now be explained in detail with reference to the drawings.

Figure 1:
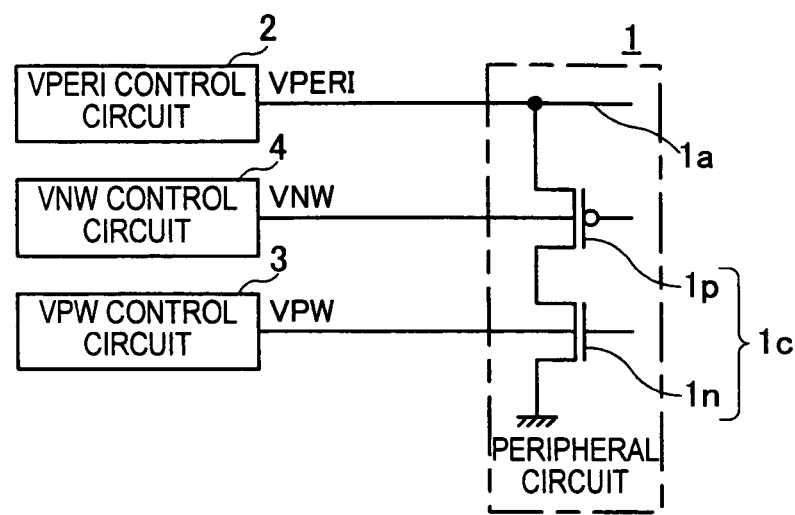
FIG. 1 is a functional block diagram of a semiconductor device according to a preferred embodiment of the present invention.

FIG. 1 is a functional block diagram of a semiconductor device 1 according to a preferred embodiment of the present invention.

As shown in FIG. 1, the semiconductor device 1 according to this embodiment includes a peripheral circuit including a complementary field effect transistor, and a VPERI control circuit 2, a VPW control circuit 3, and a VNW control circuit 4 that supply voltage to the complementary field effect transistor and the like.

Specific examples of the semiconductor device 1 include semiconductor memories such as a DRAM and a PRAM, and logic semiconductor devices such as processors. Where the semiconductor device 1 is a DRAM, the peripheral circuit is a circuit that is placed near a memory cell array, and includes a row decoder, a column decoder, and the like.

The complementary field effect transistor is a transistor that is formed with a first field effect transistor of a first conductivity type and a second field effect transistor of a second conductivity type. Although not particularly limited to this, the complementary field effect transistor, the first field effect transistor, and the second field effect transistor in the following description are a CMOS 1c, an n-channel MOS transistor 1n, and a p-channel MOS transistor 1, respectively, as shown in FIG. 1. The CMOS 1c has a structure in which the p-channel MOS transistor 1p and the n-channel MOS transistor 1n are connected in series in this order between a power-supply wiring 1a to which a power-supply voltage VPERI is supplied and a ground (the wiring to which an external ground voltage VSS is supplied; this also applies in the later description), as shown in FIG. 1. Although only one CMOS is shown in FIG. 1, the peripheral circuit includes a large number of chained CMOSs in reality.

The VPERI control circuit 2 is a circuit that supplies the power-supply voltage VPERI of the CMOS 1c. The power-supply voltage VPERI is a voltage of approximately 1.0 V to 1.3 V, if the minimum processing size of the semiconductor device 1 is in the range of 40 nm to 50 nm, for example. The power-supply voltage VPERI is supplied to the drain of the p-channel MOS transistor 1p. The VPERI control circuit 2 has a function to maintain the current value of the ON current of the CMOS 1c at a given target value $I_1$ (the first target value, which is 100 µA, for example), regardless of ambient temperature. More specifically, the current value of the ON current of the CMOS 1c varies not only with ambient temperature but also with the voltage value of the power-supply voltage VPERI, but the VPERI control circuit 2 takes advantage of such characteristics of the ON current to control the voltage value of the power-supply voltage VPERI so that the current value of the ON current of the CMOS 1c stays at the target value $I_1$.

The VPW control circuit 3 and the VNW control circuit 4 are circuits that supply a substrate voltage VPW of the n-channel MOS transistor 1n and a substrate voltage VNW of the p-channel MOS transistor 1p, respectively. The VPW control circuit 3 and the VNW control circuit 4 each have a function to maintain the current value of the OFF current of the corresponding MOS at a given target value $I_2$ (the second target value, which is 0.1 µA, for example) or $I_3$ (the third target value, which is 0.1 µA, for example), regardless of ambient temperature. More specifically, the current value of the OFF current of each MOS transistor varies not only with ambient temperature but also with the voltage value of the corresponding substrate voltage. However, the VPW control circuit 3 and the VNW control circuit 4 each take advantage of such characteristics of the OFF current. The VPW control circuit 3 and the VNW control circuit 4 each control the voltage value of the corresponding substrate voltage so that the current value of the OFF current of the corresponding MOS transistor stays at the target value $I_2$ or $I_3$.

Figure 2:
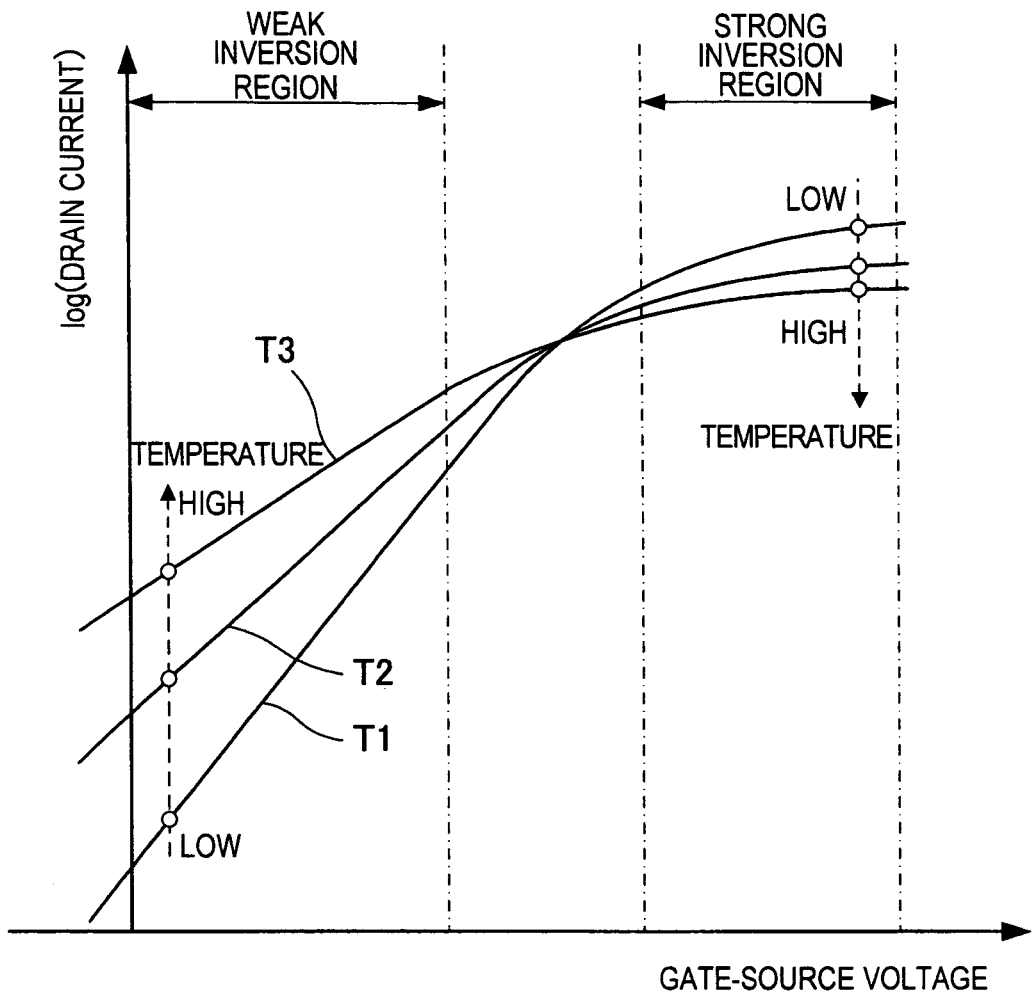
FIG. 2 is a graph showing the characteristics of the drain current of a MOS transistor with respect to the gate-source voltage.

FIG. 2 is a graph showing the characteristics of the drain current of a MOS transistor with respect to the gate-source voltage. The same characteristics are obtained with either an n-channel MOS transistor or a p-channel MOS transistor. The ordinate axis is the logarithmic axis. The "weak inversion region" shown in FIG. 2 is the gate-source voltage value region where the MOS transistor is in an OFF state. The "strong inversion region" is the gate-source voltage value region where the MOS transistor is in an ON state. As shown in FIG. 2, a very weak drain current (OFF current) is flowing in the MOS transistor even in an OFF state. In this specification, "OFF" indicates electric nonconductivity, and are also referred to as an "OFF current", an "OFF state", or the like. Meanwhile, "ON" indicates electric conductivity, and are also referred to as an "ON current", an "ON state", or the like.

The characteristics of the drain current with respect to the gate-source voltage vary with temperature. FIG. 2 shows characteristics corresponding to three temperatures T1, T2, and T3 (T1<T2<T3). As can be seen from those characteristics, in the "weak inversion region", the drain current (the OFF current) becomes larger as the temperature becomes higher. In the "strong inversion region", on the other hand, the drain current (the ON current) becomes smaller as the temperature becomes higher. In other words, the drain current has positive temperature characteristics in the "weak inversion region", and has negative temperature characteristics in the "strong inversion region". Furthermore, the change with respect to the gate-source voltage is a squared change in the "strong inversion region", while the change with respect to the gate-source voltage is an exponential change in the "weak inversion region". This means that the ON current of the "strong inversion region" and the OFF current of the "weak inversion region" need to be controlled in different manners from each other. More specifically, the ON current having low sensitivity to the threshold voltage needs to be controlled with the voltage VPERI, and the OFF current having high sensitivity to the threshold voltage needs to be controlled with the control substrate voltage.

The VPERI control circuit 2, the VPW control circuit 3, and the VNW control circuit 4 compensate for the variations among the products and the temperature dependence of the characteristics of the drain current with respect to the gate-source voltage, so as to obtain an almost constant drain current, regardless of the variations among the products and temperature.

In the following, each of the VPERI control circuit 2, the VPW control circuit 3, and the VNW control circuit 4 is described in detail successively.

Figure 3:
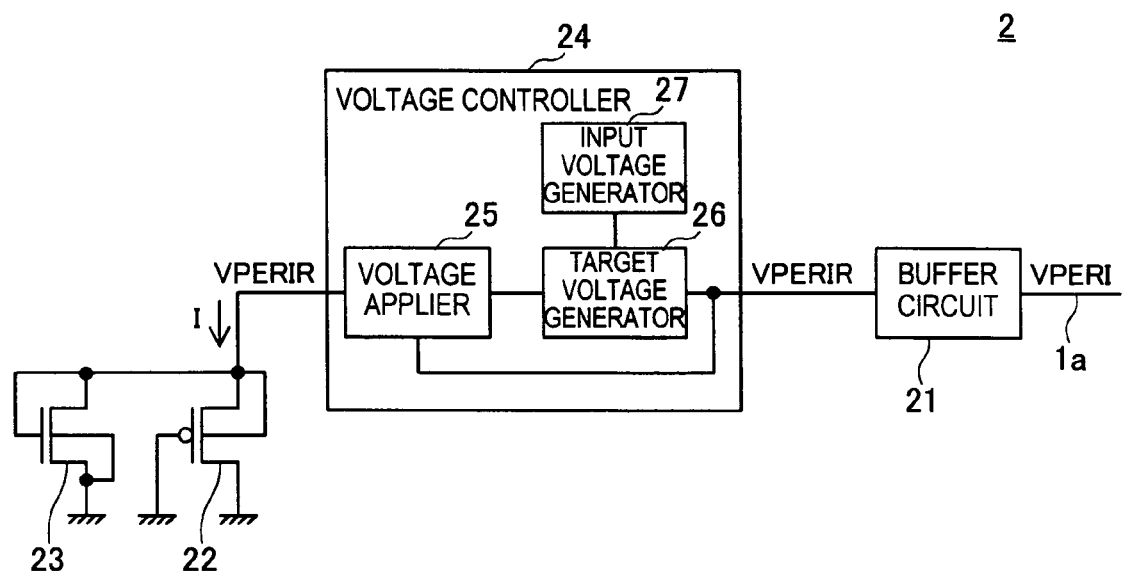
FIG. 3 is a schematic block diagram showing the functional blocks of the VPERI control circuit according to a preferred embodiment of the present invention.
Figure 4:
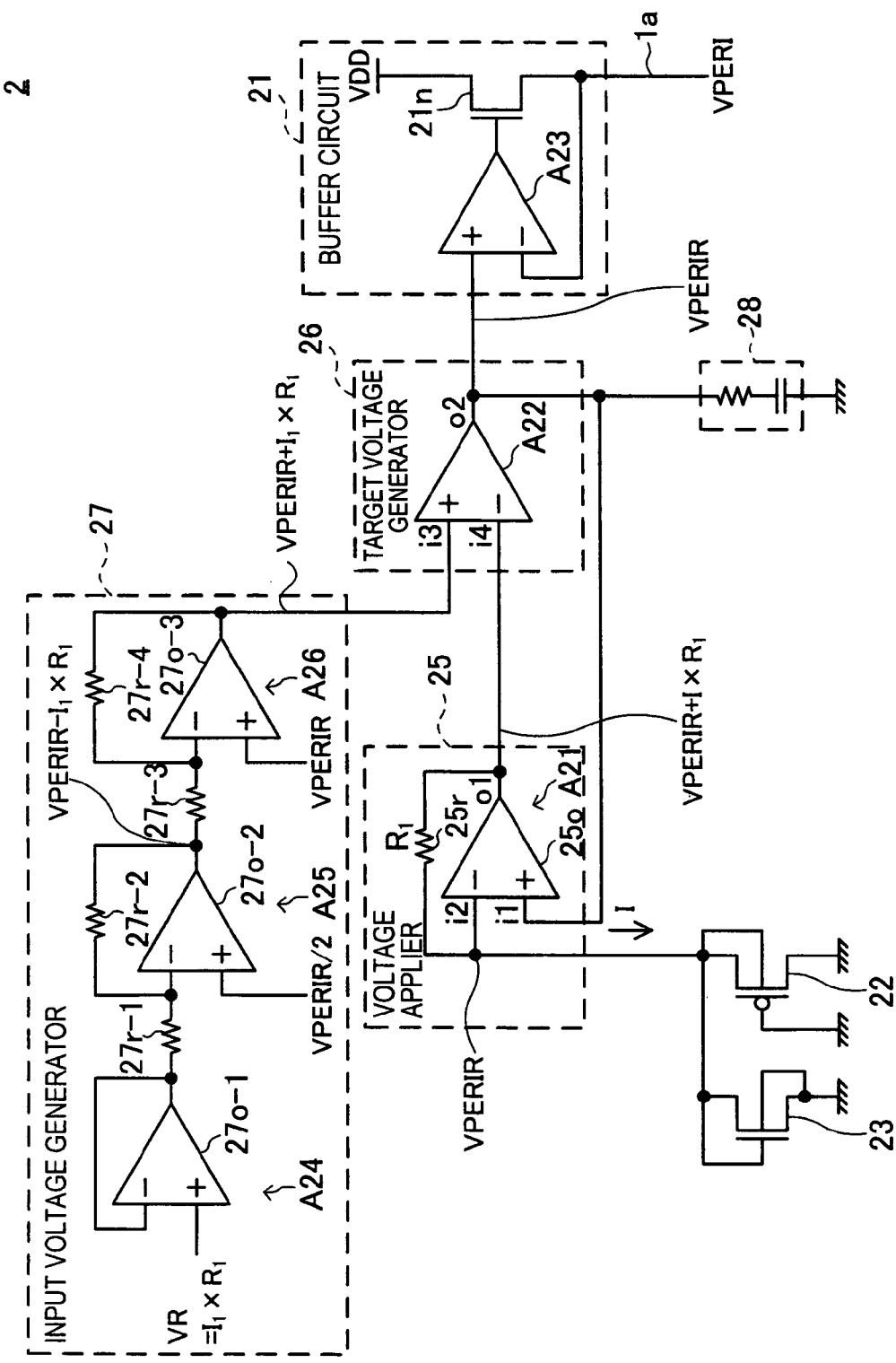
FIG. 4 is a circuit diagram of the VPERI control circuit according to a preferred embodiment of the present invention.

FIG. 3 is a schematic block diagram showing the functional blocks of the VPERI control circuit 2. FIG. 4 is a circuit diagram of the VPERI control circuit 2. As shown in FIG. 3, the VPERI control circuit 2 includes a buffer circuit 21, replica transistors 22 and 23, and a voltage controller 24.

The buffer circuit 21 is a circuit that generates the power-supply voltage VPERI of the CMOS 1c, with the target voltage being a voltage VPERIR (described later) controlled by the voltage controller 24. More specifically, as shown in FIG. 4, the buffer circuit 21 includes an n-channel MOS transistor 21*n* connected between a power-supply wiring to which an external power-supply voltage VDD is supplied and the above described power-supply wiring 1*a*. The buffer circuit 21 also includes a comparator A23. The power-supply voltage VPERI is supplied to the power-supply wiring 1*a*.

The inverting input terminal of the comparator A23 is connected to the power-supply wiring 1*a*, and receives the voltage VPERI generated from the buffer circuit 21. The voltage VPERIR (described later) is supplied from the voltage controller 24 (or a target voltage generator 26) to the noninverting input terminal of the comparator A23. Accordingly, the comparator A23 compares the voltage VPERI with the voltage VPERIR. If the voltage VPERI is lower than the voltage VPERIR, the comparator A23 outputs a high-level signal. If the voltage VPERI is higher than the voltage VPERIR, the comparator A23 outputs a low-level signal. As a result, when the voltage VPERI becomes lower than the voltage VPERIR, the transistor 21*n* is put into an ON state, and the power-supply wiring 1*a* is connected to the external power-supply voltage VDD. Accordingly, the potential of the power-supply wiring 1*a* gradually becomes higher. On the other hand, when the voltage VPERI becomes higher than the voltage VPERIR, the transistor 21*n* is put into an OFF state, and the power-supply wiring 1*a* is disconnected from the external power-supply voltage VDD. Accordingly, the potential of the power-supply wiring 1*a* gradually becomes lower. Through the above operation, the potential of the power-supply wiring 1*a* becomes equal to the voltage VPERIR at last. A potential having a predetermined ratio to the potential of the voltage VPERI may be input to the inverting input terminal of the comparator A23.

Instead of the buffer circuit 21, a buffer circuit 51 described later with reference to FIG. 8 may be used. This aspect will be described in detail when the buffer circuit 51 is explained.

The replica transistor 22 (the first replica transistor) is a replica of the p-channel MOS transistor 1*p* shown in FIG. 1. A replica is a structure that has the same impurity profile, the same W/L ratio, the same gate insulating film thickness as the original, and is formed on the same substrate or a substrate having the same impurity density as the original. As shown in FIG. 3 and others, the replica transistor 22 is diode-connected, and is forward-connected between the voltage controller 24 and the ground. More specifically, the anode of the replica transistor 22 is connected to the voltage controller 24, and the cathode of the replica transistor 22 is grounded. The W/L represents the channel width/channel length, and indicates the transistor size. The channel width (W) is related to the total amount of current, and the channel length (L) is related to the amount of current per circuit area. More specifically, "L" represents the distance between the drain and the source of the transistor, and relates to the direction of the current flowing between the drain and source terminals. Meanwhile, "W" determines the total amount of current flowing in the transistor.

The replica transistor 23 (the second replica transistor) is a replica of the n-channel MOS transistor 1*n* shown in FIG. 1. As shown in FIG. 3 and others, the replica transistor 23 is also diode-connected, and is forward-connected between the voltage controller 24 and the ground. More specifically, the anode of the replica transistor 23 is connected to the voltage controller 24, and the cathode of the replica transistor 23 is grounded. The replica transistor 22 and the replica transistor 23 are connected in parallel between the voltage controller 24 and the ground.

The voltage controller 24 (the voltage control circuit) controls the voltage between the anode and cathode of the replica transistors 22 and 23, so that the forward current I (the ON current) flowing in the replica transistors 22 and 23 becomes equal to the target value $I_1$. The forward current I (the ON current) is the total current flow (the aggregate current) of the currents flowing in the replica transistors 22 and 23. In the following, the structure and operation of the voltage controller 24 are described in detail.

First, the structure of the voltage controller 24 is described.

As shown in FIG. 3, a voltage applier 25, the target voltage generator 26, and an input voltage generator 27 are provided inside the voltage controller 24. As shown in FIG. 4, the voltage applier 25 (the first voltage applying circuit) includes a noninverting amplifier A21 that is formed with an operational amplifier 25*o* having input terminals i1 and i2 and an output terminal o1, and a feedback resistor 25*r* of a resistance value $R_1$. The input terminal i1 is a noninverting input terminal, and the input terminal i2 is an inverting input terminal. The feedback resistor 25*r* is inserted between the output terminal o1 and the input terminal i2. The input terminal i2 is connected to the anode of the replica transistors 22 and 23.

The target voltage generator 26 (the target voltage generating circuit) includes a comparator A22 having input terminals i3 and i4 and an output terminal o2, as shown in FIG. 4. The input terminal i3 is a noninverting input terminal, and the input terminal i4 is an inverting input terminal. The input terminal i4 is connected to the output terminal o1 of the voltage applier 25, and the output terminal o2 is connected to the noninverting input terminal of the comparator A23 in the buffer circuit 21.

As shown in FIG. 4, the input voltage generator 27 (the first input voltage generating circuit) includes a voltage follower A24 that is formed with an operational amplifier 27*o*-1, a noninverting amplifier A25 that is formed with an operational amplifier 27*o*-2, an input resistor 27*r*-1, and a feedback resistor 27*r*-2, and a noninverting amplifier A26 that is formed with an operational amplifier 27*o*-3, an input resistor 27*r*-3, and a feedback resistor 27*r*-4.

The inverting input terminal and the output terminal of the operational amplifier 27*o*-1 are connected to each other. A voltage VR that is generated from a bandgap circuit (not shown) generating a substance-specific constant potential is supplied to the noninverting input terminal of the operational amplifier 27*o*-1. Generated from the bandgap circuit, the voltage VR has very low temperature dependence. A voltage VPERIR/2 that is half the size of the voltage VPERIR generated from the target voltage generator 26 is supplied to the noninverting input terminal of the operational amplifier 27*o*-2. The voltage VPERIR generated from the target voltage generator 26 is supplied to the noninverting input terminal of the operational amplifier 27*o*-3. The output terminal of the operational amplifier 27*o*-1 and the inverting input terminal of the operational amplifier 27*o*-2 are connected to each other via the input resistor 27*r*-1. The output terminal of the operational amplifier 27*o*-2 and the inverting input terminal of the operational amplifier 27*o*-3 are connected to each other via the input resistor 27*r*-3. The output of the noninverting amplifier A26 is also the output of the input voltage generator 27, and is supplied to the input terminal i3 of the target voltage generator 26. The resistors 27*r*-1 through 27*r*-4 have the same resistance values.

In addition to the above components, the voltage controller 24 includes a phase compensating circuit 28 that is inserted between the ground and the wiring connecting the input terminal it and the output terminal o2, as shown in FIG. 4. In this embodiment, a resistive element and a capacitive element connected in series are used as a specific example of the phase compensating circuit 28.

Next, the operation of the voltage controller 24 is described.

The voltage applier 25 applies the voltage VPERIR between the anode and cathode of the replica transistors 22 and 23. More specifically, the voltage of the input terminal i2 becomes equal to the voltage of the input terminal i1, because of virtual short-circuiting of the operational amplifier 25o. Since the voltage VPERIR generated by the target voltage generator 26 is input to the input terminal i1, the voltage of the input terminal i2 becomes equal to the voltage VPERIR. Accordingly, the voltage VPERIR is applied to the anode of the replica transistors 22 and 23. Since the cathode of the replica transistors 22 and 23 is grounded, the anode-cathode voltage of the replica transistors 22 and 23 becomes equal to the voltage VPERIR.

By virtue of the voltage VPERIR applied between the anode and cathode, the forward current I (the ON current) in accordance with the voltage VPERIR flows in the replica transistors 22 and 23. With the current I flowing, a voltage having a voltage value VPERIR+I×$R_1$ appears in the output terminal o1 of the voltage applier 25. The voltage VPERIR+I×$R_1$ is input to the input terminal i4 of the target voltage generator 26.

The input voltage generator 27 is the circuit that generates the input voltage of the input terminal i3 of the target voltage generator 26. This input voltage is the output voltage of the output terminal o1 that is determined in accordance with the above described target value $I_1$ (the target value of the current value of the ON current flowing in the replica transistors 22 and 23). In other words, the above input voltage is the voltage that appears in the output terminal o1 when the current value of the forward current of the replica transistors and 23 becomes equal to the target value $I_1$. Accordingly, the input voltage is VPERIR+$I_1$×$R_1$.

The specific voltage value of the above described voltage VR is set at $I_1$×$R_1$, and the input voltage generator 27 generates the above input voltage VPERIR+$I_1$×$R_1$ from the voltage VR. More specifically, the voltage follower A24 first receives an input of the voltage VR, and supplies a current to the noninverting amplifier A25, with the input impedance being infinite. Since the voltage amplification factor of the voltage follower A24 is ×1, the voltage to be supplied to the noninverting amplifier A25 remains the voltage VR.

The noninverting amplifiers A25 and A26 form a level-shift circuit that shifts the level of the voltage VR that is input from the voltage follower A24, based on the voltage VPERIR. More specifically, in the noninverting amplifiers A25 and A26, a voltage $-V_-+2\times V_+$ appears in the output terminals, where the voltages to be input to each inverting input terminal and each noninverting input terminal are $V_-$ and $V_+$, respectively. Accordingly, the output voltages of the noninverting amplifiers A25 and A26 are voltages VPERIR-$I_1$×$R_1$ and VPERIR+$I_1$×$R_1$, respectively, as shown in FIG. 4.

Based on the difference between the target value $I_1$ and the current I flowing in the replica transistors 22 and 23, the target voltage generator 26 generates the voltage VPERIR that is the target voltage of the voltage control of the buffer circuit 21. In other words, the target voltage generator 26 generates the voltage VPERIR, based on the voltage VPERIR+$I_1$×$R_1$ that is input from the input voltage generator 27 to the input terminal i3 and the output voltage (the voltage that is input to the input terminal i4) VPERIR+I×$R_1$ of the voltage applier 25.

More specifically, in accordance with the difference $I_1$×$R_1$-I×$R_1$ between the voltage VPERIR+$I_1$×$R_1$ and the voltage VPERIR+I×$R_1$, the target voltage generator 26 generates the voltage VPERIR so that the current value of the current I approximates the target value $I_1$. When the difference has a positive value (I<$I_1$), the voltage VPERIR is made higher. As a result, the voltage applied between the anode and cathode of the replica transistors 22 and 23 becomes higher, and the current value of the current I becomes greater. At the same time, the power-supply voltage VPERI generated by the buffer circuit 21 also becomes higher, and accordingly, the ON current flowing in the CMOS 1c (FIG. 1) in the peripheral circuit also increases. When the difference has a negative value (I>$I_1$), on the other hand, the voltage VPERIR is made lower. As a result, the voltage applied between the anode and cathode of the replica transistors 22 and 23 becomes lower, and the current value of the current I becomes smaller. At the same time, the power-supply voltage VPERI generated by the buffer circuit 21 also becomes lower, and accordingly, the ON current flowing in the CMOS 1c (FIG. 1) in the peripheral circuit also decreases.

As a result of the above described operation of the voltage controller 24, the ON current flowing in the CMOS 1c in the peripheral circuit is maintained at the constant value $I_1$, regardless of ambient temperature. Accordingly, a constant operation speed can be achieved, regardless of ambient temperature. Also, even if variations in film thickness and line width are caused among products, a constant operation speed can be achieved.

Since the replica transistors 22 and 23 that are replicas of the p-channel MOS transistor 1p and the n-channel MOS transistor 1n, respectively, are connected in parallel between the voltage applier 25 and the ground, the mean value of the ON current of the transistor 1p and the transistor 1n becomes the above described constant value I. Accordingly, even if the p-channel MOS transistor and the n-channel MOS transistor vary with ambient temperature changes independently of each other in the peripheral circuit formed with a large number of chained CMOSs, a constant operation speed can be achieved in the entire chain.

Furthermore, with the two replica transistors, the variations among MOSs as products are averaged. Accordingly, the operation speed can be more effectively kept at a constant value.

The resistance value $R_1$ of the feedback resistor 25r should preferably be determined so that the voltage VR (=$I_1$×$R_1$) has a value between 0.2 V and 0.5 V. This is because, if the voltage VR is too low, the error of the output of the target voltage generator 26 becomes larger, and, if the voltage VR is too high, the MOSs forming the voltage controller 24 easily enter a desaturated region.

The internal structures of the operational amplifiers (the operational amplifiers 25c, 27o-1 through 27o-3, the comparators A22 and A23, and the like) used in the semiconductor device 1 are now described in detail.

Figures 5A, 5B:
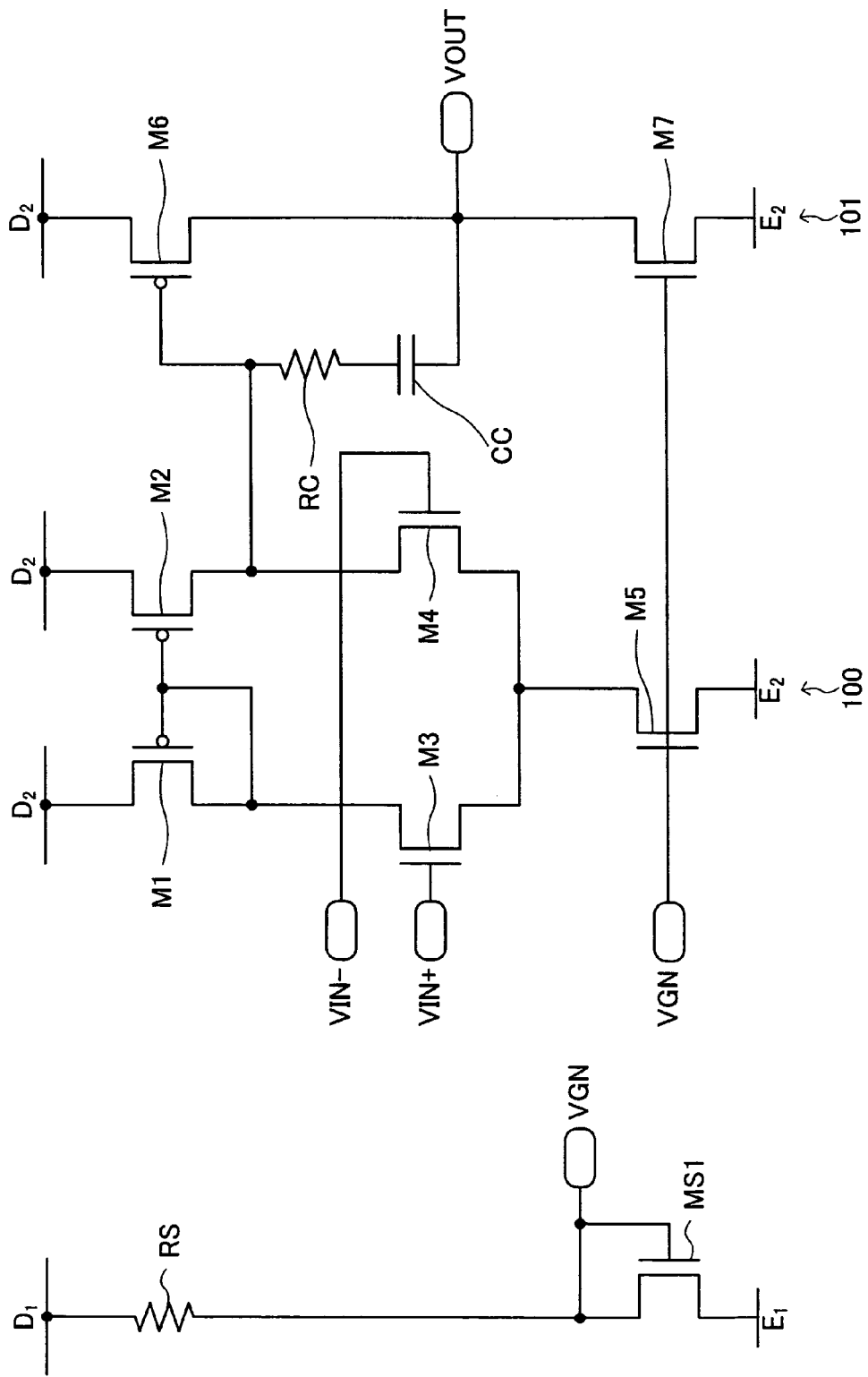
FIG. 5A is a circuit diagram of a constant current circuit for supplying a constant voltage to an operational amplifier used in a semiconductor device according to a preferred embodiment of the present invention.
FIG. 5B is a circuit diagram showing the internal structure of an operational amplifier used in a semiconductor device according to a preferred embodiment of the present invention.

FIG. 5A is a circuit diagram of a constant current circuit for supplying a constant voltage VGN to an operational amplifier. FIG. 5B is a circuit diagram showing the internal structure of an operational amplifier.

The constant current circuit illustrated in FIG. 5A has a structure in which a resistor RS and an n-channel MOS transistor MS1 are connected in series in this order between the wiring to which a power-supply voltage $D_1$ is supplied and the wiring to which a ground voltage $E_1$ is supplied. The transistor MS1 is diode-connected, and the constant voltage VGN is output from the connecting point between the resistor RS and the transistor MS1. The specific voltage values of the power-supply voltage $D_1$ and the ground voltage $E_1$ may be the same as the external power-supply voltage VDD and the external ground voltage VSS, respectively.

An operational amplifier has a structure that is formed with a differential amplifier circuit 100 and an output circuit 101 cascade-connected to each other, as shown in FIG. 5B. More specifically, an input VIN− of the inverting input terminal and an input VIN+ of the noninverting input terminal are first supplied to the differential amplifier circuit 100, and the output of the differential amplifier circuit 100 is supplied to the output circuit 101. The output of the output circuit 101 becomes the output VOUT of the output terminal.

The differential amplifier circuit 100 is formed with p-channel MOS transistors M1 and M2 current-mirror connected to each other, n-channel MOS transistors M3 and M4 connected in series to the transistors M1 and M2, respectively, and an n-channel MOS transistor M5 connected to the sources of the transistors M3 and M4. The ground voltage $E_2$ is supplied to the drain of the transistor M5, and the voltage VGN is supplied to the gate of the transistor M5. The power-supply voltage $D_2$ is supplied to the drains of the transistors M1 and M2. The input VIN+ of the noninverting input terminal is input to the gate of the transistor M3, and the input VIN− of the inverting input terminal is input to the gate of the transistor M4. The output of the differential amplifier circuit 100 is output from the connecting point between the transistor M2 and the transistor M4.

The output circuit 101 is formed with a p-channel MOS transistor M6 having the output of the differential amplifier circuit 100 supplied to its gate, an n-channel MOS transistor M7 connected to the source of the transistor M6, and a phase-compensating resistor RC and capacitor CC connected in series between the gate and the drain of the transistor M6. The ground voltage $E_2$ is supplied to the drain of the transistor M7, and the voltage VGN is supplied to the gate of the transistor M7. The power-supply voltage $D_2$ is supplied to the drain of the transistor M6. The output of the output circuit 101 is output from the source of the transistor M7, and becomes the output VOUT of the operational amplifier.

In the operational amplifiers in the VPERI control circuit 2 shown in FIG. 4, the power-supply voltage $D_2$ is a power-supply voltage VPP (>VDD) that is obtained by boosting the external power-supply voltage VDD (=1.2 V). This is because the output voltage (VPERIR+I×$R_1$) of the operational amplifier 25o and the output voltage (VPERIR+$I_1$×$R_1$) of the operational amplifier 27o-3 might become higher than the external power-supply voltage VDD. The specific value of the power-supply voltage VPP is preferably 1.5 V or higher, where the voltage VPERIR is 1.0 V, the voltage VR is 0.3 V, and the minimum source-drain voltage VDS required for each MOS transistor to enter a saturation region is 0.2 V. Meanwhile, the ground voltage $E_2$ may be equal to the external ground voltage VSS.

FIGS. 5A and 5B show an operational amplifier of an n-channel MOS transistor input type that has n-channel MOS transistors as the transistors M3 and M4. However, the differential amplifier circuit 100 may be an operational amplifier of a p-channel MOS transistor input type that has p-channel MOS transistors as the transistors M3 and M4. It is possible to determine which operational amplifier to use in accordance with the size of the input VIN+. More specifically, where the input VIN+ is larger than 0.5 V but is smaller than VPP-0.2 V, it is preferable to use an operational amplifier of an n-channel MOS transistor input type. Where the input VIN+ is equal to or smaller than 0.5 V, it is preferable to use an operational amplifier of a p-channel MOS transistor input type.

Next, two modifications of the VPERI control circuit 2 are described.

Figure 6:
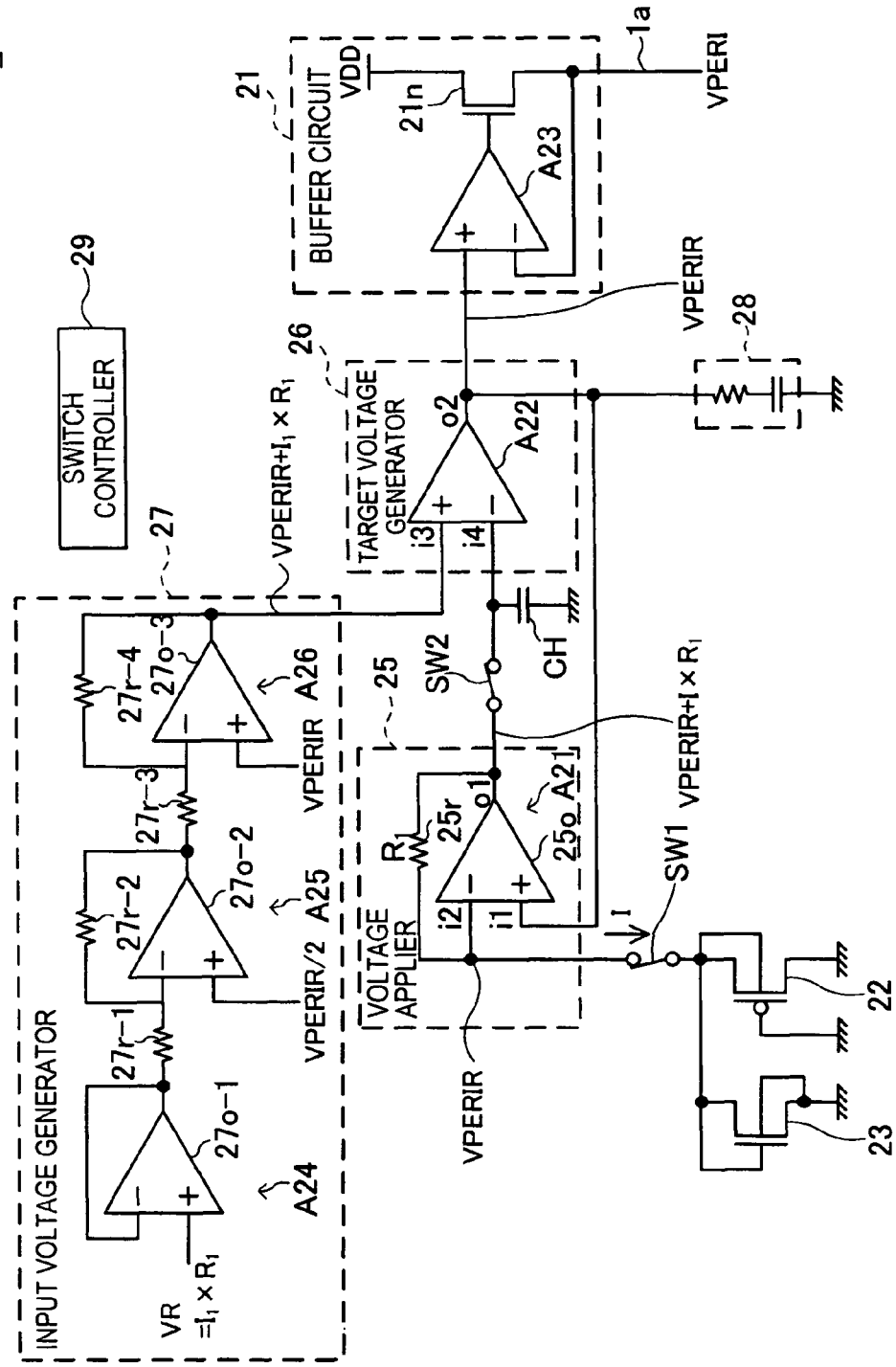
FIG. 6 is a circuit diagram of a VPERI control circuit according to a first modification of a preferred embodiment of the present invention.

FIG. 6 is a circuit diagram of a VPERI control circuit 2 according to a first modification. In the VPERI control circuit 2 according to this modification, the power consumption is smaller than the power consumption in the VPERI control circuit 2 illustrated in FIG. 4. More specifically, the VPERI control circuit 2 is the circuit that compensates the ON current of the CMOSs in the peripheral circuit by keeping the power-supply voltage VPERI at a constant value. Therefore, the VPERI control circuit 2 needs to operate in the strong inversion region (FIG. 2) having high current density, and the current flowing inside is as large as several tens of microamperes to several hundreds of microamperes. Such a large current flowing inside leads to an increase in the power consumption of the VPERI control circuit 2. It is possible to reduce the current flowing inside the VPERI control circuit 2 by actually lowering the W/L ratio of the replica transistors by means of providing a plural of replica transistors connected in series, for example. However, the current value of the current flowing in such replica transistors differs from the current value of the current flowing in the transistors in the peripheral circuit, and the original function to maintain the operational current in the peripheral circuit in a uniform state is adversely affected. The VPERI control circuit 2 according to this modification was developed in view of those circumstances, and is capable of reducing the power consumption of the VPERI control circuit 2 while maintaining the current value of the current flowing inside.

As shown in FIG. 6, the VPERI control circuit 2 according to this modification differs from the VPERI control circuit 2 of FIG. 4 only in that a switch controller 29, switch elements SW1 and SW2, and a capacitive element CH are added. In the following, the difference is mainly described.

As shown in FIG. 6, the switch element SW1 is inserted between the input terminal i2 and the anode of the replica transistors 22 and 23. The switch element SW2 is inserted between the output terminal of and the input terminal i4. The capacitive element CH is inserted between the ground and the wiring connecting the switch element SW2 and the input terminal i4.

The switch controller 29 (the first switch control circuit) periodically opens and closes the switch elements SW1 and SW2. More specifically, the switch controller 29 closes (turns on) the switch elements SW1 and SW2, to charge the capacitive element CH with a voltage VPERIR+I×R while allowing the current I to flow into the replica transistors 22 and 23. After a predetermined period of time has passed since the closing of the switch elements SW1 and SW2, the switch controller 29 opens (turns off) the switch elements SW1 and SW2. In this situation, the voltage VPERIR+I×R is supplied from the capacitive element CH to the input terminal i4 of the target voltage generator 26. Accordingly, current does not flow into the replica transistors 22 and 23 while the switch elements SW1 and SW2 are open, but the power-supply voltage VPERI can be appropriately generated. In this manner, the power consumption of the VPERI control circuit 2 can be reduced, while the current value of the current flowing inside the VPERI control circuit 2 is maintained.

The period of time during which the switch elements SW1 and SW2 are closed, and the period of time during which the switch elements SW1 and SW2 are open are preferably 1 microsecond and 10 microseconds, respectively, for example. In such a case, the power consumption of the VPERI control circuit 2 is reduced to 1/10 of the power consumption of a case where the switch elements SW1 and SW2 are not provided.

To open the switch elements SW1 and SW2, the switch element SW2 is preferably opened first, and the switch element SW1 is opened after a short interval. To close the switch elements SW1 and SW2, the switch element SW1 is preferably closed first, and the switch element SW2 is closed after a short interval. This is to prevent inappropriate changes in the amount of charges accumulated in the capacitive element CH when the switch elements SW1 and SW2 are opened and closed. Here, "open and close" or "opening and closing" are equivalent to "ON and OFF", where "OFF" indicates electric nonconductivity, and "ON" indicates electric conductivity.

Figure 7:
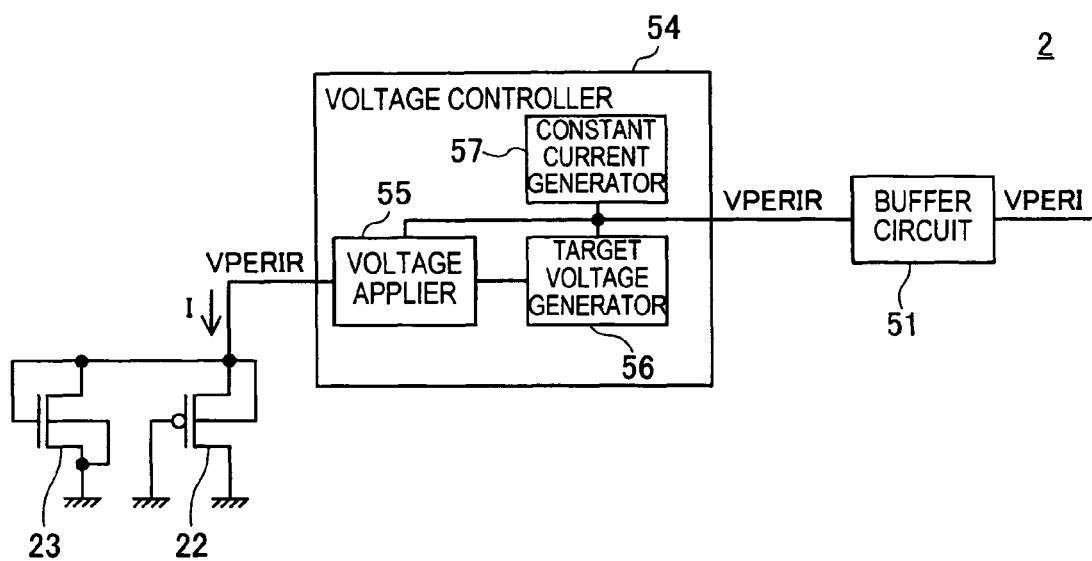
FIG. 7 is a schematic block diagram showing the functional blocks of a VPERI control circuit according to a second modification of a preferred embodiment of the present invention.

FIG. 7 is a schematic block diagram showing the functional blocks of a VPERI control circuit 2 according to a second modification. FIG. 8 is a circuit diagram of the VPERI control circuit 2 according to the second modification. As shown in FIG. 7, the VPERI control circuit 2 according to the second modification includes a buffer circuit 51 and a voltage controller 54, instead of the buffer circuit 21 and the voltage controller 24.

In the VPERI control circuit 2 illustrated in FIGS. 3 and 4, a boosted power-supply voltage VPP needs to be supplied to the transistors in the operational amplifiers, as described with reference to FIGS. 5A and 5B. In the VPERI control circuit 2 according to this modification, on the other hand, the power-supply voltage VPP is unnecessary. In the following, the structure and operation of the VPERI control circuit 2 are described in detail.

The buffer circuit 51 is the circuit that generates the power-supply voltage VPERI of the CMOS 1c (FIG. 1), with the target voltage being the voltage VPERIR controlled by the voltage controller 54. More specifically, the buffer circuit 51 includes a p-channel MOS transistor 51p connected between the power-supply wiring 1a and the power-supply wiring to which the external power-supply voltage VDD is supplied, and a comparator A52 as shown in FIG. 8. The power-supply voltage VPERI is supplied to the power-supply wiring 1a.

The noninverting input terminal of the comparator A52 is connected to the power-supply wiring 1a, and receives the voltage VPERI generated from the buffer circuit 51. The voltage VPERIR is supplied from the target voltage generator 56 to the inverting input terminal of the comparator A52. Accordingly, the comparator A52 compares the voltage VPERI with the voltage VPERIR. If the voltage VPERI is lower than the voltage VPERIR, the comparator A52 outputs a low-level signal. If the voltage VPERI is higher than the voltage VPERIR, the comparator A52 outputs a high-level signal. As a result, when the voltage VPERI becomes lower than the voltage VPERIR, the transistor 51p is put into an ON state, and the power-supply wiring 1a is connected to the external power-supply voltage VDD. Accordingly, the potential of the power-supply wiring 1a gradually becomes higher. On the other hand, when the voltage VPERI becomes higher than the voltage VPERIR, the transistor 51p is put into an OFF state, and the power-supply wiring 1a is disconnected from the external power-supply voltage VDD. Accordingly, the potential of the power-supply wiring 1a gradually becomes lower. Through the above operation, the potential of the power-supply wiring 1a becomes equal to the voltage VPERIR at last.

Instead of the buffer circuit 51, the buffer circuit 21 illustrated in FIG. 4 and others may be used. The buffer circuit 21 and the buffer circuit 51 each have advantages and disadvantages, and therefore, it is preferable to select one of them as needed. Where an n-channel MOS transistor is used as in the buffer circuit 21, relatively high-speed transient response characteristics are achieved, and only a small stabilizing capacity is required. However, a boosted power-supply voltage VPP is required. Where a p-channel MOS transistor is used as in the buffer circuit 51, on the other hand, relatively low-speed transient response characteristics are achieved, and a relatively large stabilizing capacity is required. However, the power-supply voltage VPP is unnecessary. It is preferable to determine which one of the buffer circuit and the buffer circuit 51 to use, with those advantages and disadvantages being taken into consideration.

Like the voltage controller 24 illustrated in FIG. 3 and others, the voltage controller 54 (the voltage control circuit) controls the voltage between the anode and cathode of the replica transistors 22 and 23, so that the forward current I (the ON current) flowing in the replica transistors 22 and 23 becomes equal to the target value $I_1$. In the following, the structure and operation of the voltage controller 54 are described in detail.

First, the structure of the voltage controller 54 is described. As shown in FIG. 7, a voltage applier 55, a target voltage generator 56, and a constant current generator 57 are provided inside the voltage controller 54. As shown in FIG. 8, the voltage applier 55 (the first voltage applying circuit) includes an operational amplifier A51 and a current control circuit 55c including p-channel MOS transistors 55p-1 and 55p-2. The transistors 55p-1 and 55p-2 have the same size (the same W/L ratio) as each other.

The noninverting input terminal and the inverting input terminal of the operational amplifier A51 form the input terminals i5 and i6 of the voltage applier 55, respectively. The input terminal i5 is connected to the anode of the replica transistors 22 and 23. The sources of the transistors 55p-1 and 55p-2 form the output terminals o3 and o4 of the voltage applier 55, respectively. The gates of the transistors 55p-1 and 55p-2 are both connected to the output terminal of the operational amplifier A51, and the external power-supply voltage VDD is supplied to each drain. The output terminal o3 is connected to the input terminal i5.

Figure 8:
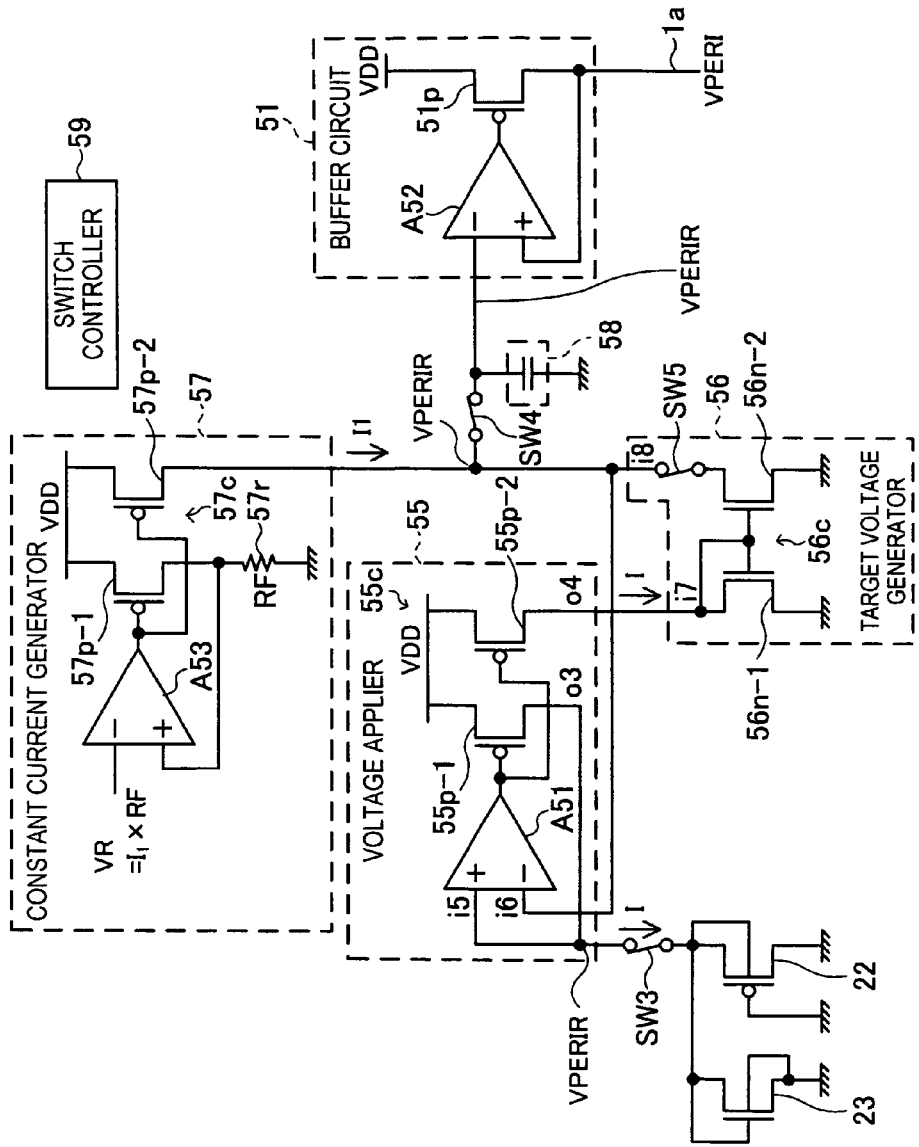
FIG. 8 is a circuit diagram of a VPERI control circuit according to a second modification of a preferred embodiment of the present invention.

The target voltage generator 56 (the target voltage generating circuit) includes a current control circuit 56c including n-channel MOS transistors 56n-1 and 56n-2, as shown in FIG. 8. The transistors 56n-1 and 56n-2 have the same size (the same W/L ratio) as each other.

The sources of the transistors 56n-1 and 56n-2 form the input terminals i7 and i8 of the target voltage generator 56, respectively, and the drains are both grounded. The gate of the transistor 56n-1 and the gate of the transistor 56n-2 are connected to each other, and the transistor 56-1 is diode-connected. The input terminal i7 is connected to the output terminal o4 of the voltage applier 55, and the input terminal i8 is connected to the input terminal i6 of the voltage applier 55.

The constant current generator 57 (the constant current generating circuit) includes an operational amplifier A53, a current control circuit 57c including p-channel MOS transistors 57p-1 and 57p-2, and a resistor 57r of a resistance value RF, as shown in FIG. 8. The transistors 57p-1 and 57p-2 have the same size (the same W/L ratio) as each other.

The gates of the transistors 57p-1 and 57p-2 are both connected to the output terminal of the operational amplifier A53, and the external power-supply voltage VDD is supplied to each drain. The source of the transistor 57p-1 is connected to the noninverting input terminal of the operational amplifier A53, and the source of the transistor 57p-2 is connected to the input terminal i8 of the target voltage generator 56. The resistor 57r is connected between the ground and the wiring connecting the source of the transistor 57p-1 and the noninverting input terminal of the operational amplifier A53. The voltage VR generated from a bandgap circuit (not shown) is supplied to the inverting input terminal of the operational amplifier A53. Generated from a bandgap circuit, the voltage VR has very low temperature dependence.

In addition to the above components, the voltage controller 54 includes a phase compensating circuit 58 that is inserted between the ground and the wiring connecting the input terminal i8 and the buffer circuit 51, as shown in FIG. 8. In this embodiment, a capacitive element is used as a specific example of the phase compensating circuit 58.

The specific structures of the operational amplifiers A51 through A53 are the same as the structure of the operational amplifier illustrated in FIGS. 5A and 5B. However, the power-supply voltage $D_2$ is not the power-supply voltage VPP (>VDD) but is the external power-supply voltage VDD.

Next, the operation of the voltage controller 54 is described.

The voltage applier 55 applies the voltage VPERIR between the anode and cathode of the replica transistors 22 and 23. More specifically, the voltage of the input terminal i5 becomes equal to the voltage of the input terminal i6, because of virtual short-circuiting of the operational amplifier A51. Since the voltage VPERIR generated by the target voltage generator 26 is input to the input terminal i6, the voltage VPERIR is applied to the anode of the replica transistors 22 and 23. As the cathode of the replica transistors 22 and 23 is grounded, the anode-cathode voltage of the replica transistors 22 and 23 becomes equal to the voltage VPERIR.

By virtue of the voltage VPERIR applied between the anode and cathode, the forward current I (the ON current) in accordance with the voltage VPERIR flows in the replica transistors 22 and 23, as described with reference to FIG. 4.

The current I flows from the output terminal o3 of the voltage applier 55 toward the replica transistors 22 and 23. Since the transistor 55p-1 and the transistor 55p-2 form a current mirror structure in the current control circuit 55c, the current I of the same current value flows into the output terminal o4 (the source of the transistor 55p-2) when the current I flows into the output terminal o3 (the source of the transistor 55p-1). Accordingly, the current I is input to the input terminal i7 of the target voltage generator 26.

The constant current generator 57 is the circuit that generates a constant current $I_1$ having the same current value as the target value $I_1$, and outputs the constant current $I_1$ to the input terminal i8 of the target voltage generator 56. The specific voltage value of the above described voltage VR is set at $I_1 \times RF$, and the current $VR/RF=I_1$ flows from the source of the transistor 57p-1 to the resistor 57r. Since the transistor 57p-1 and the transistor 57p-2 form a current mirror structure in the current control circuit 57c, the current $I_1$ of the same current value also flows into the source of the transistor 57p-2 when the current $I_1$ flows into the source of the transistor 57p-1. Accordingly, the current $I_1$ is input to the input terminal i8 of the target voltage generator 26.

Based on the difference between the current I flowing in the replica transistors 22 and 23 and the target value $I_1$, the target voltage generator 56 generates the voltage VPERIR that is the target voltage of the voltage control of the buffer circuit 51. In other words, the current control circuit 56c in the target voltage generator 56 controls the voltage of the input terminal i8 so that the current I flowing in the input terminal i7 becomes equal to the current $I_1$ flowing in the input terminal i8.

More specifically, in the current control circuit 56c, the transistor 56-1 and the transistor 56n-2 form a current mirror structure, and the transistor 56n-1 is diode-connected. Accordingly, the voltage (the voltage VPERIR) of the input terminal i8 becomes higher when the current I becomes smaller than the current and becomes lower when the current I becomes larger than the current $I_1$. The input terminal i8 is connected to the input terminal i6 of the voltage applier 55, and the input terminal i6 is the inverting input terminal of the operational amplifier A51. Therefore, when the voltage of the input terminal i8 becomes higher, the drain current of the transistors 55p-1 and 55p-2 in the current control circuit 55c increases. As a result, the current I flowing in the replica transistors 22 and 23 also becomes larger. Meanwhile, when the voltage of the input terminal i8 becomes higher, the voltage VPERIR to be input to the noninverting input terminal of the buffer circuit 51 becomes higher. As a result, the voltage VPERI to be supplied to the CMOS 1c in the peripheral circuit becomes higher.

When the voltage of the input terminal i8 becomes lower, on the other hand, the drain current of the transistors 55p-1 and 55p-2 in the current control circuit 55c decreases. Accordingly, the current I flowing in the replica transistors 22 and 23 also becomes smaller. Meanwhile, when the voltage of the input terminal i8 becomes lower, the voltage VPERIR to be input to the inverting input terminal of the buffer circuit 51 becomes lower. As a result, the voltage VPERI to be supplied to the CMOS 1c in the peripheral circuit becomes lower.

As a result of the above described operation of the voltage controller 54, the ON current flowing in the CMOS 1c in the peripheral circuit is maintained at the constant value $I_1$, regardless of ambient temperature. Accordingly, a constant operation speed can be achieved, regardless of ambient temperature. Also, even if variations in film thickness and line width are caused among products, a constant operation speed can be achieved.

Furthermore, there are no portions having a higher voltage than the external power-supply voltage VDD in the VPERI control circuit 2 according to this modification. Accordingly, the power-supply voltage VPP (>VDD) becomes unnecessary.

FIG. 8 also shows a switch controller 59 and switch elements SW3 through SW5. Those are not necessary components. With those components, however, the power consumption of the VPERI control circuit 2 can be reduced while the current value of the current flowing inside the VPERI control circuit 2 is maintained, as described in the first modification. This aspect is described below in detail.

As shown in FIG. 8, the switch element SW3 is inserted between the input terminal i5 and the anode of the replica transistors 22 and 23. The switch element SW4 is inserted between the input terminal i8 and the buffer circuit 51. The switch element SW5 is provided in the input terminal i8.

The switch controller 59 (the second switch control circuit) periodically opens and closes the switch elements SW3 through SW5. More specifically, the switch controller 59 first closes (turns on) the switch elements SW3 through SW5, to charge the capacitive element in the phase compensating circuit 58 with the voltage VPERIR while allowing the current I to flow into the replica transistors 22 and 23. After a predetermined period of time has passed since the closing of the switch elements SW3 through SW5, the switch controller 59 opens (turns off) the switch elements SW3 through SW5. In this situation, the voltage VPERIR is supplied from the capacitive element in the phase compensating circuit 58 to the buffer circuit 51. Accordingly, current does not flow into the replica transistors 22 and 23 while the switch elements SW3 through SW5 are open, but the power-supply voltage VPERI can be appropriately generated. In this manner, the power consumption of the VPERI control circuit 2 can be reduced, while the current value of the current flowing inside the VPERI control circuit 2 is maintained.

The period of time during which the switch elements SW3 through SW5 are closed, and the period of time during which the switch elements SW3 through SW5 are open are preferably 1 microsecond and 10 microseconds, respectively, for example. In such a case, the power consumption of the VPERI control circuit 2 is reduced to 1/10 of the power consumption of a case where the switch elements SW3 through SW5 are not provided.

To open the switch elements SW3 through SW5, the switch element SW4 is preferably opened first, and the switch elements SW3 and SW5 are opened after a short interval. To close the switch elements SW3 through SW5, the switch elements SW3 and SW5 are preferably closed first, and the switch element SW4 is closed after a short interval. This is to prevent inappropriate changes in the amount of charges accumulated in the capacitive element in the phase compensating circuit 58 when the switch elements SW3 through SW5 are opened and closed.

Figure 9:
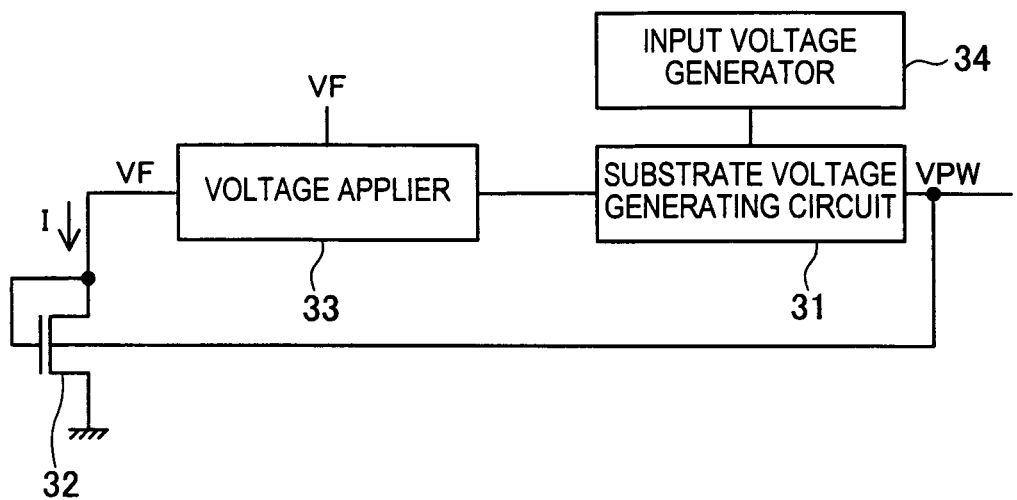
FIG. 9 is a schematic block diagram showing the functional blocks of the VPW control circuit according to a preferred embodiment of the present invention.
Figure 10:
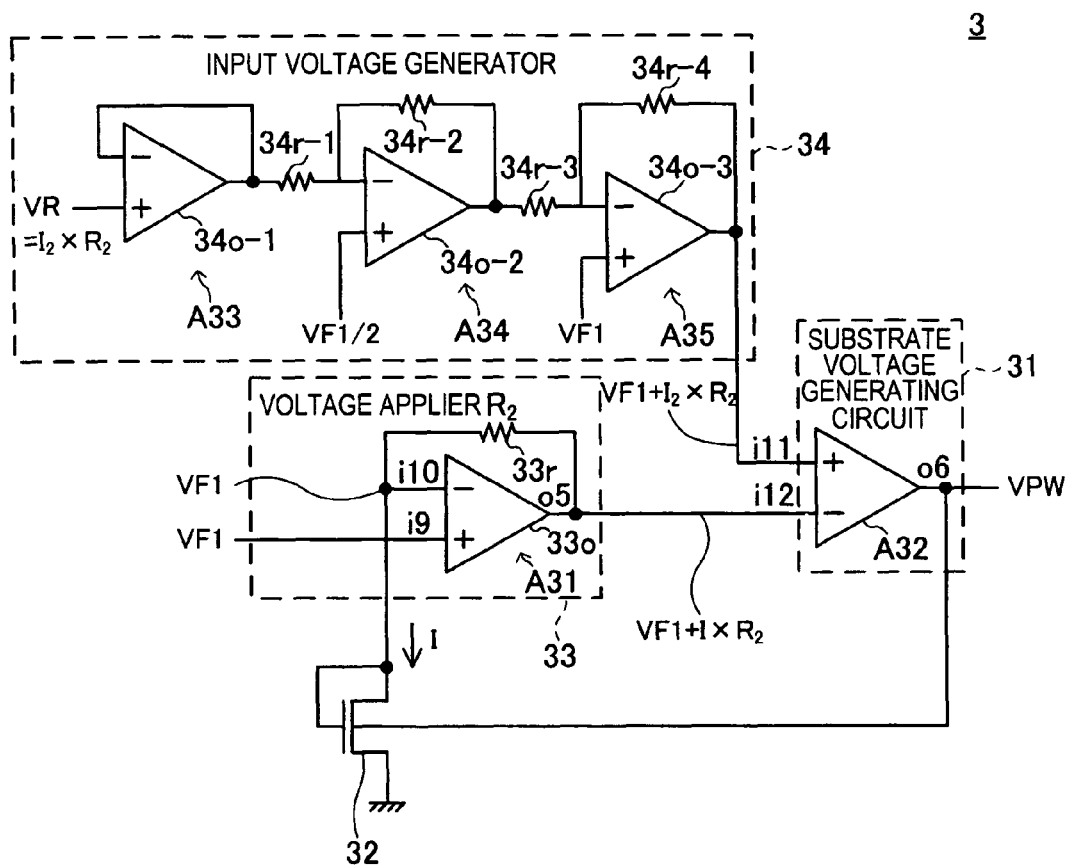
FIG. 10 is a circuit diagram of the VPW control circuit according to a preferred embodiment of the present invention.

FIG. 9 is a schematic block diagram showing the functional blocks of the VPW control circuit 3. FIG. 10 is a circuit diagram of the VPW control circuit 3. As shown in FIG. 9, the VPW control circuit 3 includes a substrate voltage generating circuit 31, a replica transistor 32, a voltage applier 33, and an input voltage generator 34. In the following, the structure of each component will be first described, and the operation of the VPW control circuit 3 will be then described.

The substrate voltage generating circuit 31 (the first substrate voltage generating circuit) is the circuit that generates the substrate voltage VPW of the n-channel MOS transistor $1n$ shown in FIG. 1. More specifically, the substrate voltage generating circuit 31 includes an operational amplifier A32 having input terminals i11 and i12 and an output terminal o6, as shown in FIG. 10. The input terminal i11 is a noninverting input terminal, and the input terminal i12 is an inverting input terminal. An output voltage of the input voltage generator 34 is supplied to the input terminal i11, and an output voltage of the voltage applier 33 is supplied to the input terminal i12.

The specific structure of the operational amplifier A32 is the same as the structure of the operational amplifier illustrated in FIGS. 5A and 5B. Here, the power-supply voltage $D_2$ is the external power-supply voltage VDD, and the ground voltage $E_2$ is a ground voltage VBBSV obtained by stepping down the external ground voltage VSS. It is preferable that the specific voltage value of the ground voltage VBBSV is between −2.5 V and −3.0 V. A power-supply voltage for an anti-fuse circuit provided in a DRAM may be used as the ground voltage $E_2$.

The replica transistor 32 (the third replica transistor) is a replica of the n-channel MOS transistor $1n$ shown in FIG. 1. As shown in FIG. 9, the replica transistor 32 is diode-connected, and is forward-connected between the voltage applier 33 and the ground. In other words, the anode of the replica transistor 32 is connected to the voltage applier 33, and the cathode is grounded. The substrate voltage VPW generated by the substrate voltage generating circuit 31 is supplied as the substrate voltage of the replica transistor 32.

As shown in FIG. 10, the voltage applier 33 (the second voltage applying circuit) includes a noninverting amplifier A31 that is formed with an operational amplifier 33$o$ having input terminals i9 and i10 and an output terminal o5, and a feedback resistor 33$r$ of a resistance value $R_2$. The input terminal i9 is a noninverting input terminal, and the input terminal i10 is an inverting input terminal. The feedback resistor 33$r$ is inserted between the output terminal o5 and the input terminal i10. The input terminal i10 is connected to the anode of the replica transistors 22 and 23. Meanwhile, a predetermined voltage VF1 is supplied to the input terminal i9.

As shown in FIG. 10, the input voltage generator 34 (the second input voltage generating circuit) includes: a voltage follower A33 formed with an operational amplifier 34$o$-1; a noninverting amplifier A34 formed with an operational amplifier 34$o$-2, an input resistor 34$r$-1, and a feedback resistor 34$r$-2; and a noninverting amplifier A35 formed with an operational amplifier 34$o$-3, an input resistor 34$r$-3, and a feedback resistor 34$r$-4. The specific internal structure of the input voltage generator 34 is the same as the above described input voltage generator 27. However, the output of the noninverting amplifier A35 that is the output of the input voltage generator 34 is supplied to the input terminal i11 of the substrate voltage generating circuit 31. A voltage VF1/2 that is half the size of the predetermined voltage VF1 is supplied to the noninverting input terminal of the operational amplifier 34$o$-2, and the predetermined voltage VF1 is supplied to the noninverting input terminal of the operational amplifier 34$o$-3.

The specific examples of the operational amplifiers 33$o$ and 34$o$-1 through 34$o$-3 are the same as the structure of the operational amplifier illustrated in FIGS. 5A and 5B. The power-supply voltage $D_2$ and the ground voltage $E_2$ are the external power-supply voltage VDD and the external ground voltage VSS, respectively.

Next, the operation of the VPW control circuit 3 is described.

First, the voltage applier 33 applies the voltage VF1 between the anode and the cathode of the replica transistor 32. As a result, the voltage of the input terminal i10 becomes equal to the voltage of the input terminal i9, due to virtual short-circuiting of the operational amplifier 33$o$. Since the predetermined voltage VF1 is input to the input terminal i9, the voltage of the input terminal i10 becomes equal to the predetermined voltage VF1. Accordingly, the voltage VF1 is applied to the anode of the replica transistor 32. Since the cathode of the replica transistor 32 is grounded, the anode-cathode voltage of the replica transistor 32 becomes equal to the voltage VF1.

The voltage VF1 is set at a voltage corresponding to the weak inversion region of MOS transistors shown in FIG. 2. Therefore, the replica transistor 32 is in an OFF state while the voltage VF1 is being applied between the anode and the cathode. Even when the replica transistor 32 is in an OFF state, the forward current I (the OFF current) corresponding to the voltage VF1 flows into the replica transistor 32, as shown in FIG. 2. With the current I flowing into the replica transistor 32, a voltage having a voltage value VF1+I×$R_2$ appears in the output terminal o5 of the voltage applier 33. This voltage VF1+I×$R_2$ is input to the input terminal i12 of the substrate voltage generating circuit 31.

The input voltage generator 34 is the circuit that generates the input voltage of the input terminal i11 of the substrate voltage generating circuit 31. This input voltage is the output voltage of the output terminal o5 determined in accordance with the above mentioned target value $I_2$ (the target value of the current value of the OFF current flowing in the replica transistor 32). In other words, the voltage that appears in the output terminal o5 when the current value of the forward current in the replica transistor 32 becomes equal to the target value $I_2$ is the above described input voltage. Accordingly, the input voltage is VF1+$I_2$×$R_2$.

The specific voltage value of the above described voltage VR is set at $I_2$×$R_2$, and the input voltage generator 34 generates the above input voltage VF1+$I_2$×$R_2$ from the voltage VR. The specific operations of the components for generating the input voltage in the input voltage generator 34 are the same as those in the input voltage generator 27, and therefore, explanation of them is not repeated here.

Based on the difference between the target value $I_2$ and the current value of the current I flowing in the replica transistor 32, the substrate voltage generating circuit 31 generates the voltage VPW so that the current value of the current I becomes equal to the target value $I_2$. In other words, the substrate voltage generating circuit 31 generates the substrate voltage VPW, based on the voltage $VF1+I_2 \times R_2$ that is input from the input voltage generator 34 to the input terminal i11 and the output voltage (the voltage that is input to the input terminal i12) $VF1+I \times R_2$ of the voltage applier 33.

More specifically, in accordance with the difference $I_2 \times R_2 - I \times R_2$ between the voltage $VF1+I_2 \times R_2$ and the voltage $VF1+I \times R_2$, the substrate voltage generating circuit 31 generates the substrate voltage VPW so that the current value of the current I approximates the target value $I_2$. When the difference has a positive value ($I<I_2$), the external power-supply voltage VDD is output to the output terminal o6, to increase the substrate voltage VPW. As a result, the threshold voltage of the replica transistor 32 becomes lower, and the current value of the current I becomes greater. At the same time, the OFF current of the n-channel MOS transistor 1n (FIG. 1) in the peripheral circuit also becomes greater. When the difference has a negative value ($I>I_2$), on the other hand, the ground voltage VBBSV ($<$VSS) is output to the output terminal o6, to lower the substrate voltage VPW. As a result, the threshold voltage of the replica transistor 32 becomes higher, and the current value of the current I becomes smaller. At the same time, the OFF current of the n-channel MOS transistor 1n (FIG. 1) in the peripheral circuit becomes smaller.

As a result of the above described operation of the VPW control circuit 3, the OFF current flowing in the n-channel MOS transistor 1n in the peripheral circuit is maintained at the constant value $I_2$, regardless of ambient temperature.

Figure 11:
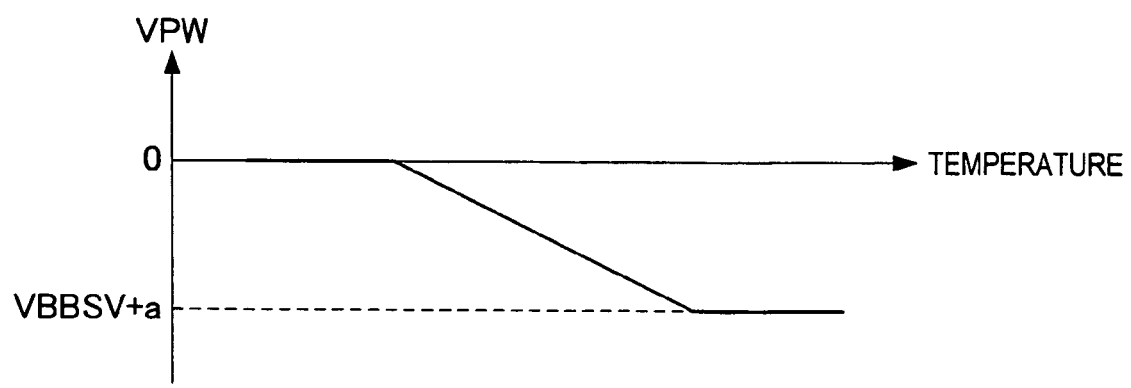
FIG. 11 is a graph showing an example of a result of a control operation performed on the substrate voltage by the VPW control circuit according to a preferred embodiment of the present invention.

FIG. 11 is a graph showing an example of a result of a control operation performed on the substrate voltage VPW. As shown in FIG. 2, the current value of the OFF current of a MOS transistor becomes greater, as the temperature becomes higher. In view of this, the VPW control circuit 3 reduces the voltage value of the substrate voltage VPW as the temperature becomes higher, as shown in FIG. 11, and reduces the current value of the OFF current of the n-channel MOS transistor.

It is preferable to put an upper limit and a lower limit on the substrate voltage VPW, as shown in FIG. 11. In FIG. 11, the upper limit is 0 V, and the lower limit is VBBSV+a ($0<a<|VBBSV|$). With this arrangement, the substrate voltage VPW can be maintained within an appropriate range. The limitation on the voltage value of the substrate voltage VPW can be realized by providing a limiter circuit.

Figure 12:
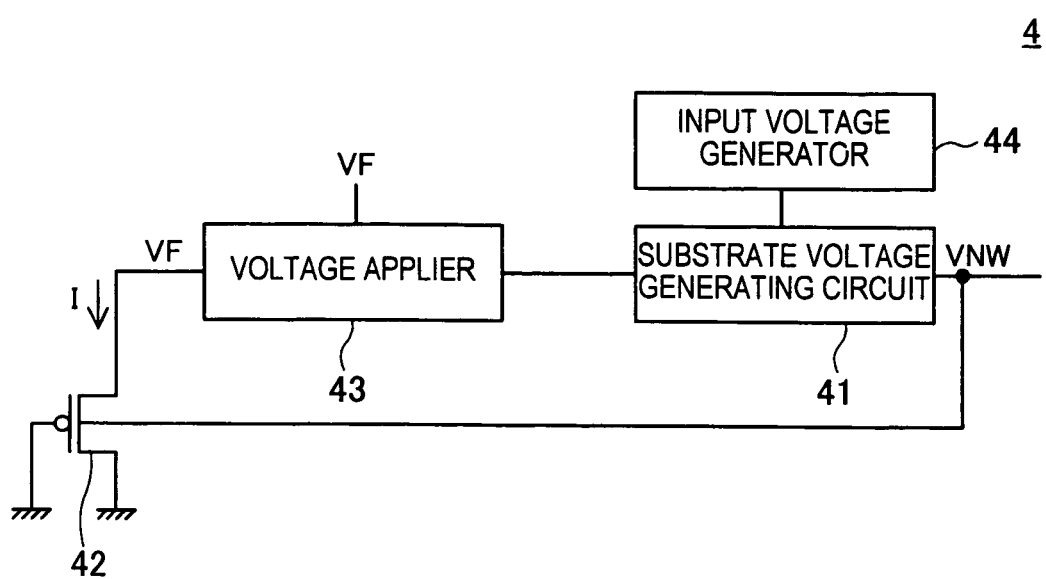
FIG. 12 is a schematic block diagram showing the functional blocks of the VNW control circuit according to a preferred embodiment of the present invention.
Figure 13:
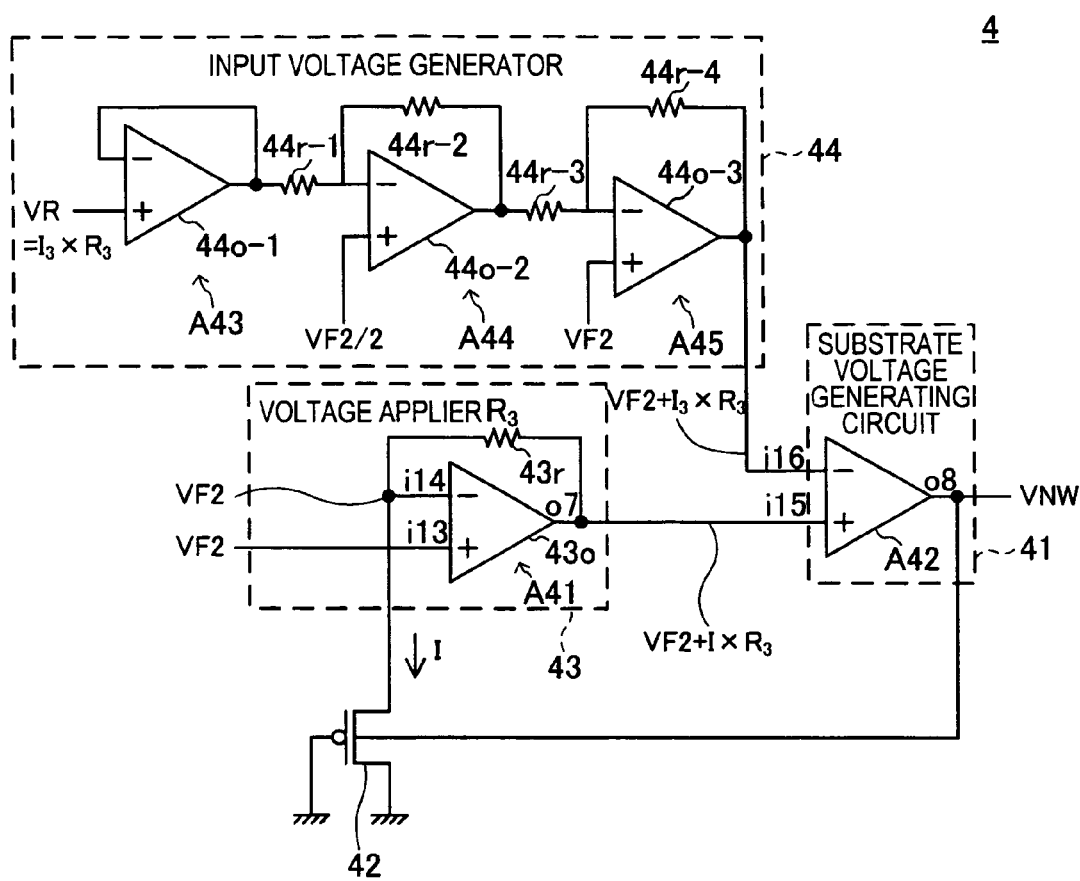
FIG. 13 is a circuit diagram of the VNW control circuit according to a preferred embodiment of the present invention.

FIG. 12 is a schematic block diagram showing the functional blocks of the VNW control circuit 4. FIG. 13 is a circuit diagram of the VNW control circuit 4. As shown in FIG. 12, the VNW control circuit 4 includes a substrate voltage generating circuit 41, a replica transistor 42, a voltage applier 43, and an input voltage generator 44. In the following, the structure of each component will be first described, and the operation of the VNW control circuit 4 will be then described.

The substrate voltage generating circuit 41 (the second substrate voltage generating circuit) is the circuit that generates the substrate voltage VNW of the p-channel MOS transistor 1p shown in FIG. 1. More specifically, the substrate voltage generating circuit 41 includes an operational amplifier A42 having input terminals i15 and i16 and an output terminal o8, as shown in FIG. 13. The input terminal i15 is a noninverting input terminal, and the input terminal i16 is an inverting input terminal. An output voltage of the voltage applier 43 is supplied to the input terminal i15, and an output voltage of the input voltage generator 44 is supplied to the input terminal i16. This relationship is the opposite of the relationship in the substrate voltage generating circuit 31 in the VPW control circuit 3.

The specific structure of the operational amplifier A42 is the same as the structure of the operational amplifier illustrated in FIGS. 5A and 5B. Here, the power-supply voltage $D_2$ is the power-supply voltage VPP ($>$VDD), and the ground voltage $E_2$ is the external ground voltage VSS.

The replica transistor 42 (the fourth replica transistor) is a replica of the p-channel MOS transistor 1p shown in FIG. 1. As shown in FIG. 12, the replica transistor 42 is diode-connected, and is forward-connected between the voltage applier 43 and the ground. In other words, the anode of the replica transistor 42 is connected to the voltage applier 43, and the cathode is grounded. The substrate voltage VNW generated by the substrate voltage generating circuit 41 is supplied as the substrate voltage of the replica transistor 42.

As shown in FIG. 13, the voltage applier 43 (the third voltage applying circuit) includes a noninverting amplifier A41 that is formed with an operational amplifier 43o having input terminals i13 and i14 and an output terminal o7, and a feedback resistor 43r of a resistance value $R_3$. The input terminal i13 is a noninverting input terminal, and the input terminal i14 is an inverting input terminal. The feedback resistor 43r is inserted between the output terminal o7 and the input terminal i14. The input terminal i14 is connected to the anode of the replica transistors 22 and 23. Meanwhile, a predetermined voltage VF2 is supplied to the input terminal i3.

As shown in FIG. 13, the input voltage generator 44 (the third input voltage generating circuit) includes: a voltage follower A43 formed with an operational amplifier 44o-1; a noninverting amplifier A44 formed with an operational amplifier 44o-2, an input resistor 44r-1, and a feedback resistor 44r-2; and a noninverting amplifier A45 formed with an operational amplifier 44o-3, an input resistor 44r-3, and a feedback resistor 44r-4. The specific internal structure of the input voltage generator 44 is the same as the above described input voltage generator 34. However, the output of the noninverting amplifier A45 that is the output of the input voltage generator 44 is supplied to the input terminal i16 of the substrate voltage generating circuit 41.

The specific examples of the operational amplifiers 43o and 44o-1 through 44o-3 are the same as the structure of the operational amplifier illustrated in FIGS. 5A and 5B. The power-supply voltage $D_2$ and the ground voltage $E_2$ are the external power-supply voltage VDD and the external ground voltage VSS, respectively.

Next, the operation of the VNW control circuit 4 is described.

First, the voltage applier 43 applies the voltage VF2 between the anode and the cathode of the replica transistor 42. More specifically, like the voltage applier 33, the voltage applier 43 applies the voltage VF2 that is input to the input terminal i13 to the anode of the replica transistor 42, due to virtual short-circuiting of the operational amplifier 43o.

The voltage VF2 is set at a voltage corresponding to the weak inversion region of MOS transistors shown in FIG. 2. Therefore, the replica transistor 42 is in an OFF state while the voltage VF2 is being applied between the anode and the cathode. Even when the replica transistor 42 is in an OFF state, the forward current I (the OFF current) corresponding to the voltage VF2 flows into the replica transistor 42, as shown in FIG. 2. With the current I flowing into the replica transistor 42, a voltage having a voltage value $VF2+I \times R_3$ appears in the output terminal o7 of the voltage applier 43.

This voltage $VF2+I \times R_3$ is input to the input terminal i15 of the substrate voltage generating circuit 41.

The input voltage generator 44 is the circuit that generates the input voltage of the input terminal i16 of the substrate voltage generating circuit 41. This input voltage is the output voltage of the output terminal o7 determined in accordance with the above mentioned target value $I_3$ (the target value of the current value of the OFF current flowing in the replica transistor 42). In other words, the voltage that appears in the output terminal o7 when the current value of the forward current in the replica transistor 42 becomes equal to the target value $I_3$ is the above described input voltage. Accordingly, the input voltage is $VF2+I_3 \times R_3$.

The specific voltage value of the above described voltage VR is set at $I_3 \times R_3$, and the input voltage generator 44 generates the above input voltage $VF2+I_3 \times R_3$ from the voltage VR. The specific operations of the components for generating the input voltage in the input voltage generator 44 are the same as those in the input voltage generator 27, and therefore, explanation of them is not repeated here.

Based on the difference between the target value $I_3$ and the current value of the current I flowing in the replica transistor 42, the substrate voltage generating circuit 41 generates the substrate voltage VNW so that the current value of the current I becomes equal to the target value $I_3$. In other words, the substrate voltage generating circuit 41 generates the substrate voltage VNW, based on the voltage $VF2+I_3 \times R_3$ that is input from the input voltage generator 44 to the input terminal i16 and the output voltage (the voltage that is input to the input terminal i15) $VF2+I \times R_3$ of the voltage applier 43.

More specifically, in accordance with the difference $I \times R_3 - I_3 \times R_3$ between the voltage $VF2+I \times R_3$ and the voltage $VF2+I_3 \times R_3$, the substrate voltage generating circuit 41 generates the substrate voltage VNW so that the current value of the current I approximates the target value $I_3$. When the difference has a positive value ($I > I_3$), the power-supply voltage VPP is output to the output terminal o8, to increase the substrate voltage VNW. When the difference has a negative value ($I < I_3$), on the other hand, the power-supply voltage VSS is output to the output terminal o8, to lower the substrate voltage VNW.

The above described operation of the substrate voltage generating circuit 41 is the opposite of the operation of the substrate voltage generating circuit in the VPW control circuit 3. Such an opposite operation is realized by supplying the output voltage of the voltage applier 43 to the input terminal i15 as a noninverting input terminal, and supplying the output voltage of the input voltage generator 44 to the input terminal i16 as an inverting input terminal.

By virtue of the above described operation of the substrate voltage generating circuit 41, the threshold voltage of the replica transistor 42 becomes higher, and the current value of the current I becomes smaller, when the current I is larger than the target value $I_3$. At the same time, the OFF current of the p-channel MOS transistor 1p (FIG. 1) in the peripheral circuit becomes smaller. When the current I is smaller than the target value $I_3$, on the other hand, the threshold voltage of the replica transistor 42 becomes lower, and the current value of the current I becomes larger. At the same time, the OFF current of the p-channel MOS transistor 1p (FIG. 1) in the peripheral circuit becomes larger. Accordingly, the OFF current flowing in the p-channel MOS transistor 1p in the peripheral circuit is maintained at the constant value $I_3$, regardless of ambient temperature.

Figure 14:
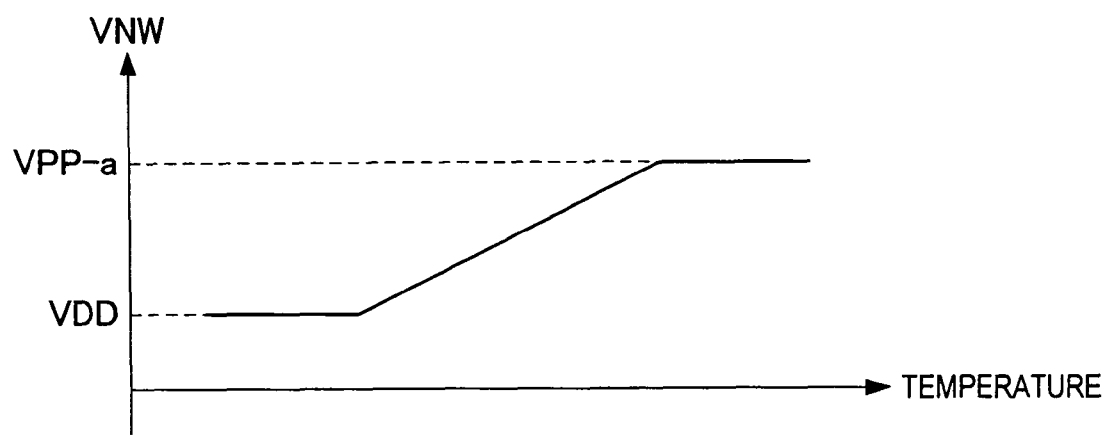
FIG. 14 is a graph showing an example of a result of a control operation performed on the substrate voltage by the VNW control circuit according to preferred embodiment of the present invention.

FIG. 14 is a graph showing an example of a result of a control operation performed on the substrate voltage VNW. As shown in FIG. 2, the current value of the OFF current of a MOS transistor becomes greater, as the temperature becomes higher. In a p-channel MOS transistor, however, the threshold voltage becomes larger, and the OFF current becomes smaller, as the voltage value of the substrate voltage VNW becomes larger. This is the opposite of the situation observed in n-channel MOS transistors. In view of this, the VNW control circuit 4 increases the voltage value of the substrate voltage VNW and reduces the current value of the OFF current of the p-channel MOS transistor, as the temperature becomes higher, as shown in FIG. 14.

It is also preferable to put an upper limit and a lower limit on the substrate voltage VNW, as shown in FIG. 14. In FIG. 14, the upper limit is VPP-a (0<a<VPP), and the lower limit is VDD. With this arrangement, the substrate voltage VNW can be maintained within an appropriate range. The limitation on the voltage value of the substrate voltage VNW can be realized by providing a limiter circuit.

For example, the VPW control circuit 3 illustrated in FIGS. 9 and 10 directly controls the substrate voltage VPW with the output of the substrate voltage generating circuit 31. However, a negative voltage pumping circuit may be provided at the output end of the substrate voltage generating circuit 31, and the switching on and off of the negative voltage pumping circuit may be controlled with the output of the substrate voltage generating circuit 31. The substrate voltage VPW may be controlled in such a manner.

Likewise, the VNW control circuit 4 illustrated in FIGS. 12 and 13 directly controls the substrate voltage VNW with the output of the substrate voltage generating circuit 41. However, a positive voltage pumping circuit may be provided at the output end of the substrate voltage generating circuit 41, and the switching on and off of the positive voltage pumping circuit may be controlled with the output of the substrate voltage generating circuit 41. The substrate voltage VNW may be controlled in such a manner.

The voltage VF1, the target value $I_2$ of the OFF current, and the feedback resistor $R_2$ used in the VPW control circuit 3 may be the same value as the voltage VF2, the target value $I_3$ of the OFF current, and the feedback resistor $R_3$ used in the VNW control circuit 4. In this case, the input voltage generator 34 in the VPW control circuit 3 and the input voltage generator 44 in the VNW control circuit 4 can be combined into one. Accordingly, the installation area and production costs of the circuits can be reduced.

The present invention may also be applied to a wide variety of field effect transistors with threshold voltages, such as MOS transistors and MIS (Metal-Insulator Semiconductors) to be formed on silicon substrates, and TFT (Thin Film Transistors) that is a kind of MOS transistor.

The present invention may also be applied to semiconductor devices having memory functions and logic functions, and semiconductor devices such as SOC (System-on-Chip), MCP (Multi-Chip Packages), and POP (Package-on-Packages) having the memory functions and logic functions mounted thereon.

What is claimed is:

1. A semiconductor device comprising:
   a buffer circuit that generates a power-supply voltage of a complementary field effect transistor circuit including a first field effect transistor of a first conductivity type and a second field effect transistor of a second conductivity type;
   a first replica transistor that is a replica of the first field effect transistor, the first replica transistor being diode-connected;
   a second replica transistor that is a replica of the second field effect transistor, the second replica transistor being diode-connected and being connected in parallel to the first replica transistor to share an anode and a cathode; and a voltage control circuit that controls a voltage between the anode and cathode shared by the first and second replica transistors in such a manner that a total current value of currents flowing in the first and second replica transistors becomes equal to a predetermined first target value, wherein the buffer circuit generates the power-supply voltage, with a target voltage being the voltage between the anode and cathode controlled by the voltage control circuit.

2. The semiconductor device as claimed in claim 1, wherein the value of each of the currents flowing in the first and second replica transistors is a current value of a strong inversion region in which temperature characteristics are negative temperature characteristics that become smaller as temperature becomes higher, and a channel region of the first and second replica transistors has a squared change with respect to a change in the voltage value between the anode and cathode shared by the first and second replica transistors.

3. The semiconductor device as claimed in claim 1, wherein the voltage control circuit comprises:
 a first voltage applying circuit that applies the target voltage between the anode and cathode shared by the first and second replica transistors; and
 a target voltage generating circuit that generates the target voltage, based on a difference between the first target value and the total current value of the currents flowing in the first and second replica transistors.

4. The semiconductor device as claimed in claim 3, wherein
 the first voltage applying circuit comprises a noninverting amplifier that includes first and second input terminals and a first output terminal,
 the target voltage generating circuit comprises a comparator that includes third and fourth input terminals and a second output terminal,
 the semiconductor device further comprises a first input voltage generating circuit that generates an input voltage of the third input terminal,
 the first input terminal and the second output terminal are connected to each other, and the first output terminal and the fourth input terminal are connected to each other,
 the first and second replica transistors are inserted in a forward direction and in parallel between the second input terminal and a ground,
 the first input voltage generating circuit generates a target value for controlling an output voltage of the first output terminal determined by the first target value, the first input voltage generating circuit outputting the target value to the third input terminal, and
 the comparator in the target voltage generating circuit generates the target voltage between the anode and cathode shared by the first and second replica transistors, based on the voltage that is input to the third input terminal and the output voltage of the first output terminal that is input to the fourth input terminal, the comparator outputting the target voltage from the second output terminal to the buffer circuit.

5. The semiconductor device as claimed in claim 4, wherein
 the noninverting amplifier comprises a feedback resistor that is inserted between the first output terminal and the second input terminal, and the target value for controlling the output voltage of the first output terminal is determined based on a resistance value of the feedback resistor.

6. The semiconductor device as claimed in claim 5, wherein the first input voltage generating circuit comprises a level-shift circuit that receives a voltage having a voltage value formed by multiplying the first target value by the resistance value of the feedback resistor, and shifts a level of the voltage having the multiplied voltage value received, based on the target voltage generated by the target voltage generating circuit.

7. The semiconductor device as claimed in claim 6, wherein the voltage that is input to the first input voltage generating circuit is generated by a bandgap circuit that generates a substance-specific constant potential.

8. The semiconductor device as claimed in claim 4, wherein the voltage control circuit further comprises a phase compensating circuit that is inserted between the ground and a wiring connecting the first input terminal and the second output terminal.

9. The semiconductor device as claimed in claim 4, wherein the voltage control circuit further comprises:
 a first switch element that is inserted between the second input terminal and the anode shared by the first and second replica transistors;
 a second switch element that is inserted between the first output terminal and the fourth input terminal;
 a capacitive element that is inserted between the ground and a wiring connecting the second switch element and the fourth input terminal; and
 a first switch control circuit that periodically controls electric nonconductivity and conductivity of each of the first and second switch elements.

10. The semiconductor device as claimed in claim 9, wherein
 the first switch control circuit makes the second switch element electrically nonconductive and makes the first switch element electrically nonconductive in this order to make the first and second switch elements electrically nonconductive, and
 the first switch control circuit makes the first switch element electrically conductive and makes the second switch element electrically conductive in this order to make the first and second switch elements electrically conductive.

11. The semiconductor device as claimed in claim 3, wherein
 the first voltage applying circuit comprises an operational amplifier that includes fifth and sixth input terminals, and a first current control circuit that includes third and fourth output terminals,
 the target voltage generating circuit comprises a second current control circuit that includes seventh and eighth input terminals,
 the semiconductor device further comprises a constant current generating circuit that generates a constant current of the first target value and outputs the constant current to the eighth input terminal,
 the sixth input terminal and the eighth input terminal are connected to each other, the fifth input terminal and the third output terminal are connected to each other, and the fourth output terminal and the seventh input terminal are connected to each other,
 the first and second replica transistors are inserted in a forward direction and in parallel between the fifth input terminal and a ground, the first current control circuit outputs a current having the same current value as a current flowing in the third output terminal, to the fourth output terminal, the second current control circuit controls a voltage of the eighth input terminal, to make a current flowing in the seventh input terminal equal to the current value of the constant current, and the buffer circuit obtains the voltage of the eighth input terminal as the target voltage.

12. The semiconductor device as claimed in claim 11, wherein the second current control circuit is a current mirror circuit that has the seventh and eighth input terminals as an input and an output.

13. The semiconductor device as claimed in claim 11, wherein the constant current generating circuit generates the constant current of the first target value, using a constant voltage generated by a bandgap circuit that generates a substance-specific constant potential.

14. The semiconductor device as claimed in claim 11, wherein the voltage control circuit further comprises a phase compensating circuit that is inserted between the ground and a wiring connecting the eighth input terminal and the buffer circuit.

15. The semiconductor device as claimed in claim 14, wherein the voltage control circuit further comprises:
a third switch element that is inserted between the anode of the first and second replica transistors, and the fifth input terminal and the third output terminal;
a fourth switch element that is inserted between the eighth input terminal and the buffer circuit;
a fifth switch element that is provided in the eighth input terminal; and
a second switch control circuit that periodically controls electric nonconductivity and conductivity of each of the third through fifth switch elements.

16. The semiconductor device as claimed in claim 15, wherein
the second switch control circuit makes the fourth switch element electrically nonconductive and makes the third and fifth switch elements electrically nonconductive in this order to make the third through fifth switch elements electrically nonconductive, and
the second switch control circuit makes the third and fifth switch elements electrically conductive and makes the fourth switch element electrically conductive in this order to make the third through fifth switch elements electrically conductive.

17. The semiconductor device as claimed in claim 1, further comprising:
a first substrate voltage generating circuit that generates a substrate voltage of one of the first and second field effect transistors;
a third replica transistor that is a replica of the one of the first and second field effect transistors, the third replica transistor being diode-connected; and
a second voltage applying circuit that applies a voltage of a predetermined first voltage value between an anode and cathode of the third replica transistor, wherein
a substrate voltage of the third replica transistor is the substrate voltage generated by the first substrate voltage generating circuit, and
the first substrate voltage generating circuit controls the substrate voltage of the third replica transistor so that a current value of a current flowing in the third replica transistor becomes equal to a predetermined second target value.

18. The semiconductor device as claimed in claim 17, wherein the first substrate voltage generating circuit generates the substrate voltage of the third replica transistor, based on a difference between the current flowing in the third replica transistor and the second target value.

19. The semiconductor device as claimed in claim 17, wherein
the second voltage applying circuit comprises a noninverting amplifier that includes ninth and tenth input terminals and a fifth output terminal,
the first substrate voltage generating circuit comprises a comparator that includes eleventh and twelfth input terminals and a sixth output terminal,
the semiconductor device further comprises a second input voltage generating circuit that generates an input voltage of the eleventh input terminal,
the fifth output terminal and the twelfth input terminal are connected to each other,
the voltage of the first voltage value is input to the ninth input terminal,
the third replica transistor is inserted in a forward direction between the tenth input terminal and a ground,
the second input voltage generating circuit generates a target value for controlling an output voltage of the fifth output terminal and determined by the second target value, and outputs the target value to the eleventh input terminal, and
the comparator in the first substrate voltage generating circuit generates the substrate voltage of the one of the first and second field effect transistors, based on the voltage that is input to the eleventh input terminal and the output voltage of the fifth output terminal that is input to the twelfth input terminal, the comparator outputting the substrate voltage from the sixth output terminal.

20. The semiconductor device as claimed in claim 19, wherein the eleventh input terminal is a noninverting input terminal, and the twelfth input terminal is an inverting input terminal.

21. The semiconductor device as claimed in claim 17, wherein the first voltage value is a voltage value that creates an OFF state in which a channel region of the third replica transistor is a weak inversion region.

22. The semiconductor device as claimed in claim 17, wherein the value of the current flowing in the third replica transistor is a current value of a weak inversion region in which temperature characteristics are positive temperature characteristics that become larger as temperature becomes higher, and a channel region of the third replica transistor has an exponential change with respect to a change in the first voltage value.

23. The semiconductor device as claimed in claim 17, further comprising:
a second substrate voltage generating circuit that generates a substrate voltage of the other one of the first and second field effect transistors;
a fourth replica transistor that is a replica of the other one of the first and second field effect transistors, the fourth replica transistor being diode-connected; and
a third voltage applying circuit that applies a voltage of a predetermined second voltage value between an anode and cathode of the fourth replica transistor, wherein
a substrate voltage of the fourth replica transistor is the substrate voltage generated by the second substrate voltage generating circuit, and
the second substrate voltage generating circuit controls the substrate voltage of the fourth replica transistor so that a current value of a current flowing in the fourth replica transistor becomes equal to a given third target value.

24. A semiconductor device comprising:
a buffer circuit that generates a power-supply voltage of a complementary field effect transistor circuit including a first field effect transistor of a first conductivity type and a second field effect transistor of a second conductivity type;
a first replica transistor that is a replica of the first field effect transistor, the first replica transistor being diode-connected;
a second replica transistor that is a replica of the second field effect transistor, the second replica transistor being diode-connected;
a noninverting amplifier that includes first and second input terminals, a first output terminal, and a feedback resistor inserted between the first output terminal and the second input terminal;
a comparator that includes third and fourth input terminals and a second output terminal; and
a first input voltage generating circuit that generates a voltage that appears in the first output terminal when a total current value of currents flowing in the first and second replica transistors is equal to a predetermined first target value, the first input voltage generating circuit outputting the voltage to the third input terminal, wherein
the first input terminal and the second output terminal are connected to each other, and the first output terminal and the fourth input terminal are connected to each other,
the first and second replica transistors are inserted in a forward direction and in parallel between the second input terminal and a ground, and
the buffer circuit generates the power-supply voltage, with a target voltage being a voltage that is output from the second output terminal.

25. A semiconductor device comprising:
a replica circuit including first and second terminals, a first replica transistor of a first conductivity type and a second replica transistor of a second conductivity type, the first replica transistor including a first source-drain path that is connected in parallel to a second source-drain path of the second replica transistor between the first and second terminals, the first replica transistor including a first gate connected to the first terminal, and the second replica transistor including a second gate connected to the second terminal; and
a voltage control circuit configured to receive a current flowing through the replica circuit to generate an internal voltage,
wherein the voltage control circuit comprises a first amplifier including a first input node that is coupled to the first terminal of the replica circuit, a second input node that is supplied with a first voltage related to the internal voltage, a first output node, and a feedback circuit that is coupled between the first output node and the first input node.

26. The semiconductor device as claimed in claim 25, wherein the second terminal is supplied with a ground voltage and the first terminal is connected to the voltage control circuit.

27. A semiconductor device comprising:
a replica circuit including first and second terminals, a first replica transistor of a first conductivity type and a second replica transistor of a second conductivity type, the first replica transistor including a first source-drain path that is connected in parallel to a second source-drain path of the second replica transistor between the first and second terminals, the first replica transistor including a first gate connected to the first terminal, and the second replica transistor including a second gate connected to the second terminal; and
a voltage control circuit configured to receive a current flowing through the replica circuit to generate an internal voltage,
wherein the second terminal is supplied with a ground voltage and the first terminal is connected to the voltage control circuit,
wherein the voltage control circuit comprises:
an amplifier circuit including a first input terminal which is supplied with a first voltage based on the current flowing through the replica circuit, a second input terminal which is supplied with a second voltage based on a predetermined current and an output terminal which outputs the internal voltage, the amplifier circuit controlling the current of the replica circuit so as to become equal to the predetermined current; and
a voltage applier circuit connected to the first terminal and outputting the first voltage to the first input terminal of the amplifier circuit.

28. The semiconductor device as claimed in 27, wherein the voltage applier circuit includes:
an additional amplifier circuit including a third input terminal which is supplied with the internal voltage, a fourth input terminal which is connected to the first terminal of the replica circuit and an additional output terminal which outputs the first voltage; and
a feedback resistor provided between the fourth input terminal and the additional output terminal.

29. The semiconductor device as claimed in claim 28, wherein the voltage control circuit further comprises an input voltage generator circuit generating the second voltage to the second input terminal of the amplifier circuit base on the predetermined current.

30. The semiconductor device as claimed in claim 29, wherein the voltage control circuit further comprises:
a first switch element provided between the first terminal of the replica circuit and the fourth input terminal of the additional amplifier circuit;
a second switch element provided between the first input terminal of the amplifier circuit and the additional output terminal of the additional amplifier circuit; and
a capacitive element provided between the second switch element and the first input terminal of the amplifier circuit.

31. The semiconductor device as claimed in claim 25, wherein the current flowing through the replica circuit increases as temperature drops.

32. The device as claimed in claim 25, wherein the feedback circuit comprises a resistor, the resistor being thereby coupled between the first output node and the first input node of the first amplifier.

33. The device as claimed in claim 32, wherein the voltage control circuit further comprises a second amplifier including a third input node that is coupled to the first output node of the first amplifier, a fourth input node that is supplied with a second voltage, and a second output node that is coupled to the second input node of the first amplifier.

34. The device as claimed in claim 25, further comprising a first switch circuit inserted between the first terminal of the replica circuit and the first input node of the first amplifier.

35. The device as claimed in claim 34, wherein the feedback circuit comprises a resistor, the resistor being thereby coupled between the first output node and the first input node of the first amplifier.

36. The device as claimed in claim 35, wherein the voltage control circuit further comprises a second amplifier including a third input node that is coupled to the first output node of the first amplifier, a fourth input node that is supplied with a second voltage, and a second output node that is coupled to the second input node of the first amplifier, and
wherein the device further comprises a second switch circuit inserted between the first output node of the first amplifier and the third input node of the second amplifier.

37. The device as claimed in claim 25, wherein the feedback circuit comprises a third transistor that includes a gate coupled to the first output node of the first amplifier and a source-drain path coupled between the first input node of the first amplifier and a power supply line.

38. The device as claimed in claim 37,
wherein the voltage control circuit further comprises:
a circuit node coupled to the second input node of the first amplifier;
a current mirror circuit including a current input node and a current output node that is coupled to the circuit node; and
a current source coupled between the circuit node and the power supply line, and
wherein the first amplifier further comprises a fourth transistor that includes a gate coupled to the first output node of the first amplifier and a source-drain path coupled between the power supply line and the current input node of the current mirror circuit.

39. The device as claimed in claim 38, further comprising a first switch circuit inserted between the first terminal of the replica circuit and the first input node of the first amplifier and a second switch circuit inserted between the circuit node and the current output node of the current mirror circuit.

* * * * *